US010234644B1

(12) United States Patent
Butler et al.

(10) Patent No.: US 10,234,644 B1
(45) Date of Patent: Mar. 19, 2019

(54) OPTICAL-ELECTRICAL PRINTED CIRCUIT BOARDS WITH INTEGRATED OPTICAL WAVEGUIDE ARRAYS AND PHOTONIC ASSEMBLIES USING SAME

(71) Applicant: CORNING OPTICAL COMMUNICATIONS LLC, Hickory, NC (US)

(72) Inventors: Douglas Llewellyn Butler, Painted Post, NY (US); James Scott Sutherland, Corning, NY (US)

(73) Assignee: Corning Optical Communications LLC, Hickory, NC (US)

( * ) Notice: Subject to any disclaimer, the term of this patent is extended or adjusted under 35 U.S.C. 154(b) by 0 days.

(21) Appl. No.: 15/789,132

(22) Filed: Oct. 20, 2017

(51) Int. Cl.
*H05K 1/18* (2006.01)
*G02B 6/125* (2006.01)
(Continued)

(52) U.S. Cl.
CPC ......... *G02B 6/423* (2013.01); *G02B 6/02395* (2013.01); *G02B 6/03616* (2013.01);
(Continued)

(58) Field of Classification Search
CPC .................................................... G02B 6/3608
See application file for complete search history.

(56) References Cited

U.S. PATENT DOCUMENTS 3,674,914 A * 7/1972 Burr ........................ H05K 3/103
174/261

3,777,154 A * 12/1973 Lindsey ............... G02B 6/3608
250/227.11
(Continued)

FOREIGN PATENT DOCUMENTS

CN         102116898 A        7/2011
DE   102009002196 A1       10/2010
(Continued)

OTHER PUBLICATIONS

Akiyama et al; "Air Trench Bends and Splitters for Dense Optical Integration in Low Index Contrast," Journal of Lightwave Technology, vol. 23, Issue: 7, pp. 2271-2277, 2005.
(Continued)

*Primary Examiner* — Rhonda S Peace
(74) *Attorney, Agent, or Firm* — Robert L. Branham

(57) ABSTRACT

The optical-electrical printed circuit board disclosed herein includes a waveguide link assembly and a printed circuit board assembly. The printed circuit board assembly has first and second PCB layers between which optical waveguides of the waveguide link assembly are disposed. The end faces the optical waveguides are accessible through an access aperture in the printed circuit board assembly. An optical interconnector can be used to optically connect the optical waveguides to waveguides of an optical-electrical integrated circuit operably disposed on the printed circuit board assembly to form a photonic device. A waveguide bending structure can be used to bend the optical waveguides to facilitate optical coupling to the optical interconnector or directly to the waveguides of the optical-electrical integrated circuit. Methods of forming an optical-electrical printed circuit board, a photonic assembly and a photonic device are also disclosed.

8 Claims, 24 Drawing Sheets

(51) Int. Cl.
  *G02B 6/42* (2006.01)
  *H05K 1/02* (2006.01)
  *H05K 3/32* (2006.01)
  *G02B 6/036* (2006.01)
  *G02B 6/02* (2006.01)
  G02B 6/38 (2006.01)

(52) U.S. Cl.
  CPC ............ *G02B 6/125* (2013.01); *G02B 6/422* (2013.01); *G02B 6/4257* (2013.01); *H05K 1/0274* (2013.01); *H05K 1/181* (2013.01); *H05K 3/32* (2013.01); *G02B 6/3898* (2013.01); *H05K 2201/09063* (2013.01); *H05K 2201/10121* (2013.01); *H05K 2203/166* (2013.01)

(56) References Cited

U.S. PATENT DOCUMENTS

| | | | | |
|---|---|---|---|---|
| 4,945,400 | A * | 7/1990 | Blonder | G02B 6/4214 257/116 |
| 5,220,628 | A * | 6/1993 | Delbare | G02B 6/2852 385/14 |
| 5,245,683 | A | 9/1993 | Belenky et al. | |
| 5,253,310 | A * | 10/1993 | Delbare | G02B 6/3839 385/14 |
| 5,786,925 | A * | 7/1998 | Goossen | G02B 6/122 359/245 |
| 5,937,133 | A * | 8/1999 | Moss | G02B 6/3608 385/130 |
| 6,154,593 | A | 11/2000 | Miura et al. | |
| 6,259,840 | B1 * | 7/2001 | Munoz-Bustamante | G02B 6/43 385/14 |
| 6,438,295 | B1 | 8/2002 | McGarry et al. | |
| 6,682,230 | B1 | 1/2004 | Demangone et al. | |
| 6,697,554 | B2 | 2/2004 | McGarry et al. | |
| 6,768,850 | B2 | 7/2004 | Dugan et al. | |
| 6,952,504 | B2 * | 10/2005 | Bi | H01S 3/0632 359/245 |
| 7,039,276 | B2 * | 5/2006 | Aldridge | B64D 43/00 385/39 |
| 7,136,551 | B2 | 11/2006 | Cho et al. | |
| 7,149,376 | B2 * | 12/2006 | Uchida | G02B 6/43 385/15 |
| 7,329,050 | B1 | 2/2008 | Dugan et al. | |
| 7,409,118 | B2 | 8/2008 | Said et al. | |
| 7,486,847 | B1 * | 2/2009 | Dellmann | G02B 6/421 385/14 |
| 7,802,927 | B2 * | 9/2010 | Benjamin | G02B 6/25 385/31 |
| 8,270,784 | B2 | 9/2012 | Thomson et al. | |
| 8,270,788 | B2 | 9/2012 | Herman et al. | |
| 8,270,792 | B1 | 9/2012 | Ng | |
| 8,469,606 | B2 | 6/2013 | Becht et al. | |
| 8,593,826 | B2 * | 11/2013 | Joe | G02B 6/4214 361/760 |
| 8,597,871 | B2 | 12/2013 | McLeod | |
| 8,641,299 | B2 * | 2/2014 | Daikuhara | G02B 6/4204 385/93 |
| 9,034,222 | B2 | 5/2015 | Koos et al. | |
| 9,057,854 | B2 * | 6/2015 | Choi | G02B 6/43 |
| 9,124,959 | B2 | 9/2015 | Xu et al. | |
| 9,323,017 | B2 | 4/2016 | Choi et al. | |
| 9,594,220 | B1 | 3/2017 | Sutherland | |
| 9,766,411 | B2 | 9/2017 | Butler et al. | |
| 2003/0031449 | A1 | 2/2003 | Simmons | G02B 6/3636 385/134 |
| 2003/0099452 | A1 | 5/2003 | Borrelli et al. | |
| 2004/0258359 | A1 | 12/2004 | Corkum et al. | |
| 2005/0196094 | A1 * | 9/2005 | Glebov | G02B 6/43 385/14 |
| 2005/0220437 | A1 * | 10/2005 | Kim | G02B 6/421 385/137 |
| 2006/0045418 | A1 * | 3/2006 | Cho | G02B 6/06 385/31 |
| 2006/0056765 | A1 | 3/2006 | Hwang et al. | |
| 2008/0008477 | A1 | 1/2008 | Ogawa | |
| 2009/0214158 | A1 | 8/2009 | Lee et al. | |
| 2009/0310906 | A1 | 12/2009 | Miyatake | |
| 2010/0178006 | A1 * | 7/2010 | Nishimura | G02B 6/4202 385/55 |
| 2012/0155811 | A1 * | 6/2012 | Chiang | G02B 6/4201 385/89 |
| 2013/0322814 | A1 * | 12/2013 | Lee | G02B 6/43 385/14 |
| 2014/0126030 | A1 | 5/2014 | Crespi et al. | |
| 2014/0270631 | A1 | 9/2014 | Choraku et al. | |
| 2016/0238786 | A1 | 8/2016 | Garner et al. | |
| 2017/0192181 | A1 * | 7/2017 | Barwicz | G02B 6/3893 |
| 2017/0343733 | A1 * | 11/2017 | Sutherland | G02B 6/125 |
| 2018/0172905 | A1 * | 6/2018 | Fortusini | G02B 6/125 |

FOREIGN PATENT DOCUMENTS

| | | | |
|---|---|---|---|
| JP | 2004046031 | A | 2/2004 |
| JP | 2005010373 | A | 1/2005 |
| JP | 2005156945 | A | 6/2005 |
| JP | 2006201014 | A | 8/2006 |
| JP | 03925209 | B2 | 6/2007 |
| JP | 2008299287 | A | 12/2008 |
| JP | 04514999 | B2 | 7/2010 |
| KR | 1272829 | B1 | 6/2013 |

OTHER PUBLICATIONS

Boisset, et al;, "Design and Construction of an Active Alignment Demonstrator for a Free-Space Optical Interconnect," IEEE Photonics Technology Letters, vol. 7, pp. 676-678, 1995.
Brusberg, et al; "Single-Mode Glass Waveguide Platform for DWDM Chip-To-Chip Interconnects," IEEE Electronic Components and Technology Conference, vol. N/A, pp. 1532-1539, 2012.
Brusberg, et al; "Thin Glass Based Packaging Technologies for Optoelectronic Modules", Proceedings of 2009 Electronic Components and Technology Conference, pp. 207-212, 2009.
Cheng, et al., "Dye-Doped Polymer Based Self-Written Waveguide for Optical Interconnection," Portable Information Devices, 2008 and the 2008 7th IEEE Conference on Polymers and Adhesives in Microelectronics and Photonics. Portable-Polytronic 2008. 2nd IEEE International Interdisciplinary Conference on, pp. 1-6, 2008.
Dai et al, "Deeply Etched SiO2 Ridge Waveguide for Sharp Bends", Journal of Lightwave Technology, vol. 24, Issue 12, pp. 5019-5024, 2006.
Deng, et al., "Self-Aligned Single-Mode Polymer Waveguide Interconnections for Efficient Chip-To-Chip Optical Coupling," vol. 12, Issue 5, pp. 923-930, 2006.
Eaton, et al., "Heat Accumulation Effects in Femtosecond Laser-Written Waveguides With Variable Repetition Rate," Optics Express, 13(12), 4708-4716, 2005.
Hiramatsu, et al; "Laser-Written Optical-Path Redirected Waveguide Device for Optical Back-Plane Interconnects," Photonics Technology Letters, IEEE, vol. 16, Issue: 9, pp. 2075-2077, 2004.
Hirose et al; "Optical Component Coupling Using Self-Written Waveguides," Optical Communication 2001. ECOC '01. 27th European Conference on, vol. 2, pp. 140-141, 2001.
Huang et al; "Ultrafast Laser Fabrication of 3D Photonic Components in Flexible Glasses, " Optical Fiber Communications Conference and Exhibition (OFC), pp. 1-3, 2014.
Jackson et al; "A High-Density, Four Channel, OEIC Transceiver Module Utilizing Planar-Processed Optical Waveguides and Flip-Chip, Solder-Bump Technology" Journal of Lightwave Technology, vol. 12, No. 7, pp. 1185-1191, Jul. 1994.
Koos et al; "Photonic Wire Bonding: Nanophotonic Interconnects Fabricated by Direct-Write 3D Lithography," Transparent Optical Networks (ICTON), 2013 15th Internatoinal Conference on, pp. 1-4, 2013.

(56) References Cited

OTHER PUBLICATIONS

Kozlov et al; "Optical Fibers With Mid and High Temperature Coatings for Harsh Environment Applications," IEEE Avionics Fiber-Optics and Photonics Technology Conference (AVFOP),pp. 7-8, 2010.
Kwack et al., "180° C. Light Path Conversion Device With Tapered Self-Written Waveguide for Optical Interconnection," Photonics Technology Letters, IEEE, vol. 22, Issue 15, pp. 1126-1128, 2010.
Lindenmann, et al, "Photonic Wire Bonding for Single-Mode Chip-To-Chip Interconnects," Group IV Photonics (GFP), 2011 8th IEEE International Conference on pp. 380-382, 2011.
Lindenmann, et al; "Connecting Silicon Photonic Circuits to Multicore Fibers by Photonic Wire Bonding," Lightwave Technology, Journal of, vol. 33, Issue 4, pp. 755-760, 2015.
Marcuse et al.; "Length Optimization of an S-Shaped Transition Between Offset Optical Waveguides," Applied Optics, vol. 17, pp. 763-768, 1978.
Nasu et al; "Developments in Laser Processing for Silica-Based Planar Lightwave Circuits," SPIE Laser-Based Micropackaging, vol. 6107, 10 pages, 2006.
Nasu et al; "Low-Loss Waveguides Written With a Femtosecond Laser for Flexible Interconnection in a Planar Light-Wave Circuit," Optics. Letters, vol. 30, pp. 723-725, 2005.
Nasu et al; "Waveguide Interconnection in Silica-Based Planar Lightwave Circuit Using Femtosecond Laser," Journal of Lightwave Technology, vol. 27, No. 18, pp. 4033-4039, 2009.
Ozawa et al; "Self-Written Waveguide Connection Between VCSEL and Optical Fiber With 45/SPL DEG/ Mirror Using Green Laser," Photonics Technology Letters, IEEE, vol. 18, Issue 3, pp. 532-534, 2005.
Ryu, et al; "Optical Interconnection for a Polymeric PLC Device Using Simple Positional Alignment," Optics Express, vol. 19, pp. 8571-8579, 2011.
Schroder, et al;, "New Options for Chip-To-Chip Photonic Packaging by Using Thin Glass Based Waveguide Substrates on Board and Module Level," Proc. of SPIE vol. 7607, p. 76070E-1-76070E-10, 2010.
Streltsov, et al., "Laser-Written High-Contrast Waveguides in Glass," Proceedgins of the SPIE, vol. 7366, 9 Pages, 2009.
Sugihara et al; "Light-Induced Self-Written Polymeric Optical Waveguides for Single-Mode Propagation and for Optical Interconnections" IEEE Photonics Technology Letters, vol. 16, pp. 804-806, 2004.
Thomson et al; "Ultrafast-Laser Inscription of a Three Dimensional Fan-Out Device for Mulitcore Fiber Coupling Applications," Optics Express, vol. 15, pp. 11691-11697; 2007.
Van Thourhout, et al., "Technologies for On-Chip Optical Interconnects," Lasers and Electro-Optics Society, 2005. LEOS 2005. The 18th Annual Meeting of the IEEE, pp. 204-205, 2005.
Vazquez, et al; "Integration of Femtosecond Laser Written Optical Waveguide in a Lab-On-Chip," Lab Chip, vol. 9, pp. 91-96, 2009.
Yagisawa, et al., "Novel Trace Design for High Data-Rate Multi-Channel Optical Transceiver Assembled Using Flip-Chip Bonding"; Electronic Components and Technology Conference (ECTC), 2014 IEEE 64th, pp. 1048-1053, 2014.
Yanagisawa, et al., "Film-Level Hybrid Integration of AlGaAs Laser Diode With Glass Waveguide on Si Substrate," IEEE Photonics Technology Letters, vol. 4, pp. 21-23, 1992.
Yoshimura, et al., "Self-Organized Lightwave Network Based on Waveguide Films for Three-Dimensional Optical Wiring Within Boxed," Lightwave Technology, Journal of, vol. 22, No. 9, 2004.
Fortusini et al; "Flexible Glass Optical-Electrical Interconnection Device and Photonic Assemblies Using Same"; Filed Dec. 19, 2017; U.S. Appl. No. 15/846,312; 67 Pages; Application and Drawings as Filed.
Fortusini et al; "Waveguide Connector Elements and Optical Assemblies Incorporating the Same" Filed Jul. 29, 2016; U.S. Appl. No. 62/368,330; 78 Pages; Application and Drawings as Filed.
Masters et al; "Optical Assemblies, Interconnection Substrates and Methods for Forming Optical Links in Interconnection Substrates" Filed Jul. 29, 2016; U.S. Appl. No. 62/368,326; 71 Pages; Application and Drawings as Filed.
International Search Report and Written Opinion PCT/US2018/056042 dated Jan. 24, 2019, 12 Pgs.

* cited by examiner

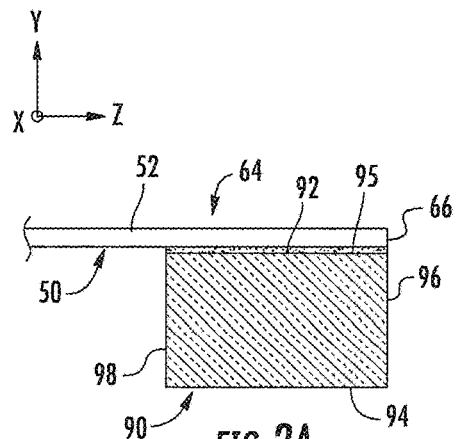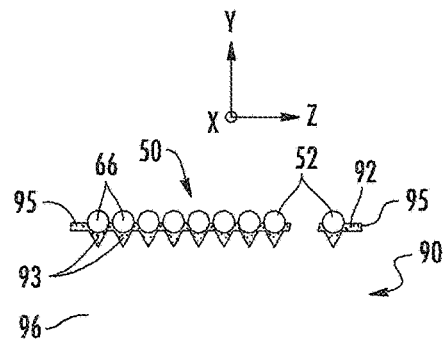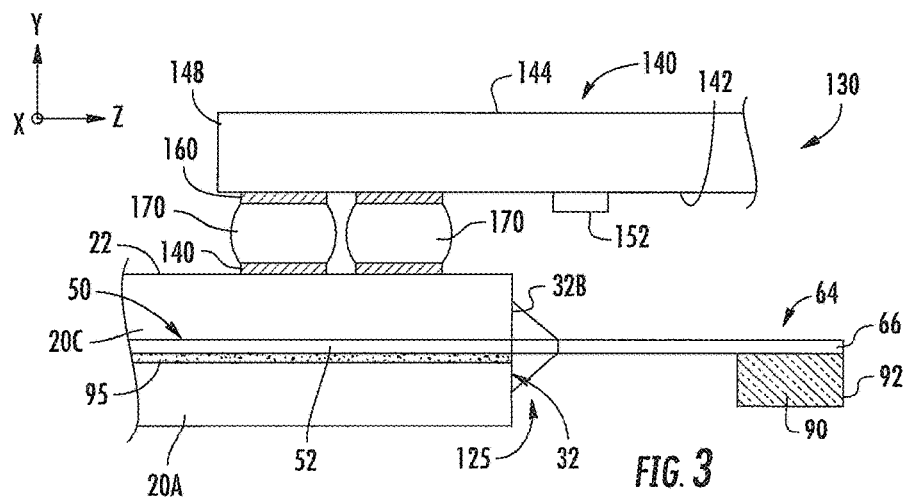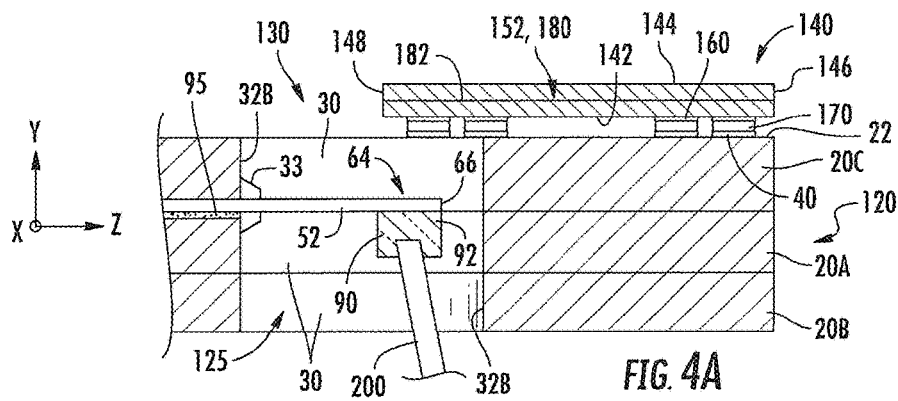

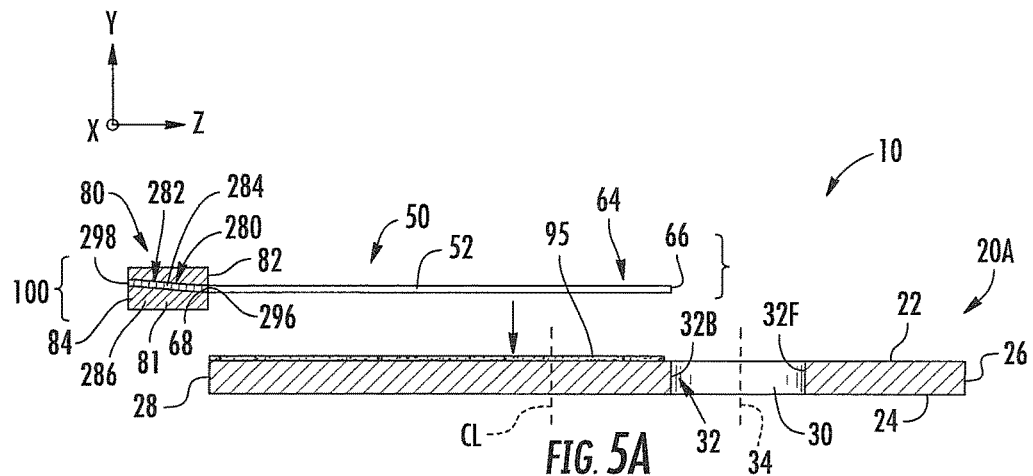
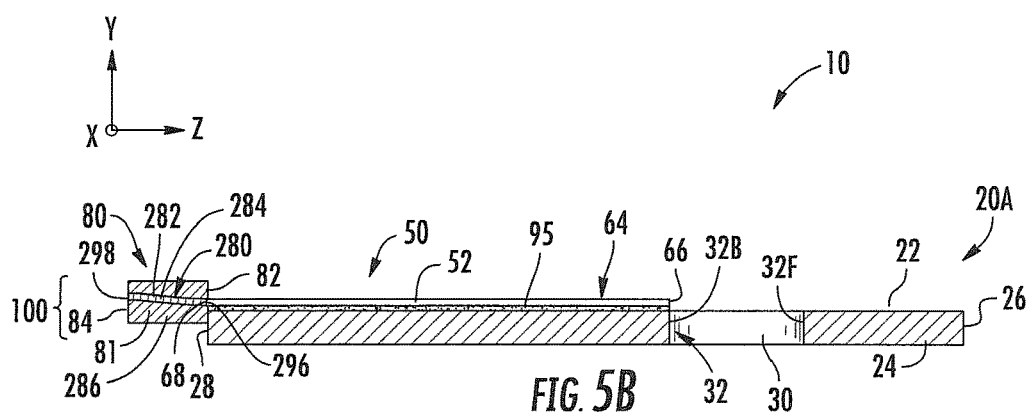
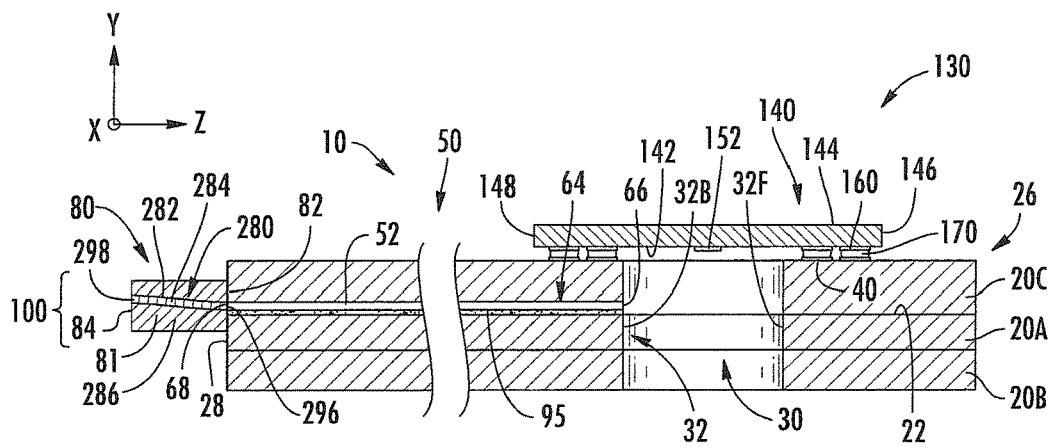

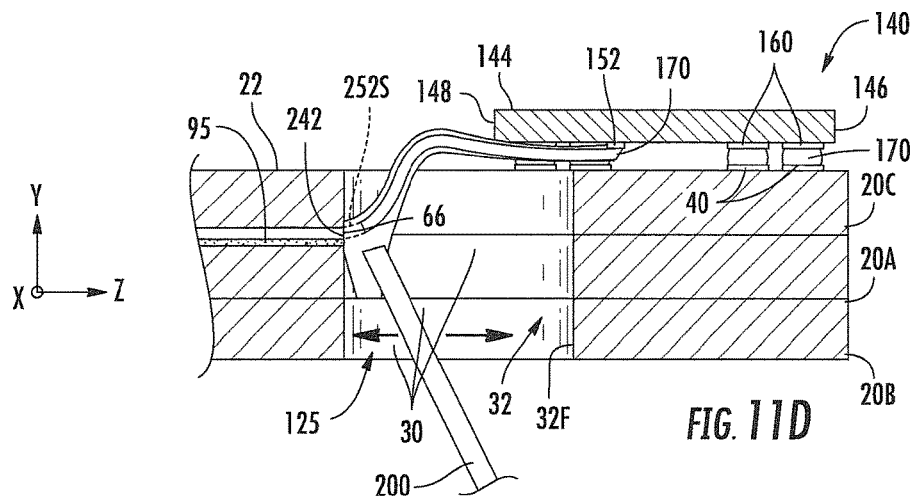
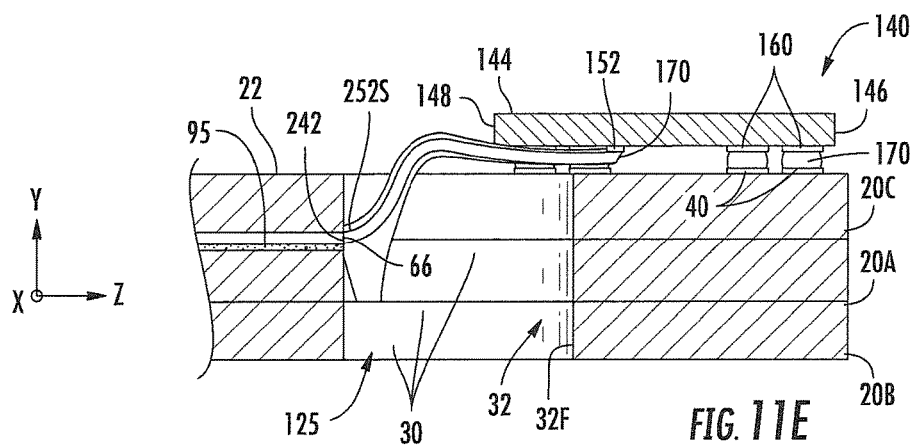
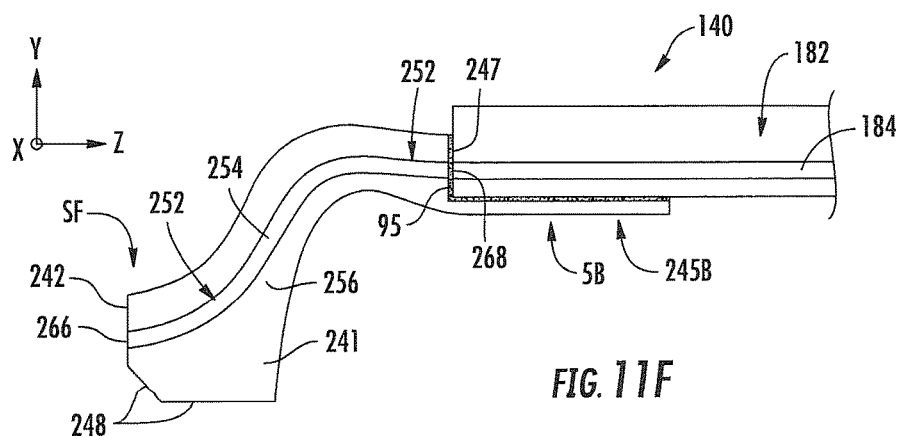

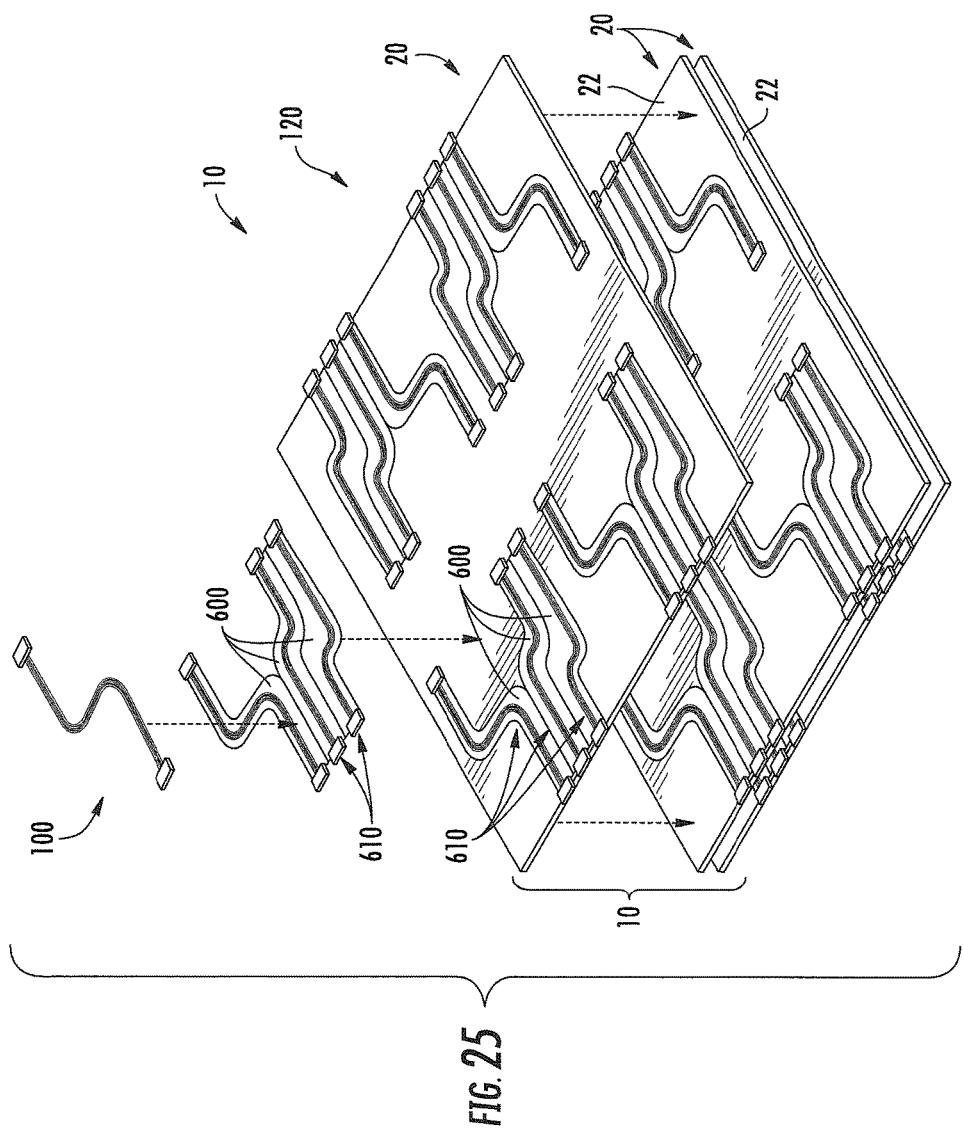

OPTICAL-ELECTRICAL PRINTED CIRCUIT BOARDS WITH INTEGRATED OPTICAL WAVEGUIDE ARRAYS AND PHOTONIC ASSEMBLIES USING SAME

FIELD

The present disclosure relates to optical-electrical printed circuit boards, and in particular relates to optical-electrical printed circuit boards with integrated optical waveguide arrays, and photonic assemblies using same.

BACKGROUND

Semiconductor integrated circuits (ICs) are typically mounted in or on a printed circuit board (PCB) as part of a packaging process for making an electrical assembly. For electrical ICs, individual metal electrical conductors are typically used to make the electrical connections between first metal pads on the IC and second metal pads on the PCB.

The need for high-bandwidth communication with electrical ICs has prompted the addition of optical waveguide connections between optical+electrical ICs ("OE-ICs") and OE-PCBs that have both optical and electrical functionality and optical and electrical connection locations. Like the electrical connections made for electrical ICs, optical and electrical connections are made between OE-ICs and OE-PCBs to form a photonic assembly.

The challenges in fabricating photonic assemblies include defining the optical waveguides and then establishing the optical interconnections between the OE-IC and the OE-PCB. Since optical waveguide technology has been used extensively in telecommunications, it would be desirable to use optical waveguides such as optical fibers as the waveguides of the OE-PCB. However, the bending requirements for the optical waveguides, along with the large number of optical interconnections needed and the alignment issues associated with making optical waveguide interconnections, have made the use of optical waveguides OE-PCBs problematic.

SUMMARY

An embodiment of the disclosure is an OE-PCB that includes: a waveguide link assembly comprising an array of optical waveguides each having a first-end section with an end face and a second end; a PCB assembly comprising at least first and second PCB layers and having opposite first and second ends, a major surface and an access aperture in the major surface and that resides between the first and second ends; and wherein the optical waveguide array is disposed between the at least first and second PCB layers, with the end faces of the first-end sections of the optical waveguides being accessible through the access aperture.

Another embodiment of the disclosure is a photonic assembly that includes: an OE-PCB that includes a PCB assembly with at least first and second PCB layers and having opposite first and second ends, a major surface and an access aperture in the major surface and between the first and second ends, and an optical waveguide array disposed between the at least first and second PCB layers, the optical waveguides having first-end sections with end faces accessible through the access aperture; an OE-IC operably disposed on the major surface of the PCB assembly, the OE-IC having an array of OE-IC devices; and an optical interconnector having an array of optical interconnection waveguides and disposed so that the optical interconnection waveguides optically interconnect the array of optical waveguides of the OE-PCB with the array of OE-IC active devices of the OE-IC.

Another embodiment of the disclosure is a photonic assembly that includes: an OE-PCB that includes a PCB assembly with at least first and second PCB layers and having opposite first and second ends, a major surface and an access aperture in the major surface and between the first and ends, and an optical waveguide array disposed between the at least first and second PCB layers, the optical waveguide array comprising optical waveguides each having a first-end section that extends into the access aperture; an OE-IC operably disposed on the top surface of the PCB assembly, the OE-IC having an array of OE-IC devices; and a waveguide bending structure that resides at least partially within the access aperture to which the first-end sections of the optical waveguides are secured to define bends in each of the optical waveguides so that the optical waveguides are optically coupled to the OE-IC devices.

Another embodiment of the disclosure is a method of forming an OE-PCB. The method includes: disposing an array of optical waveguides between first and second PCB layers, with each optical waveguide having a first-end section with an end face and an opposite second end; and securing the first and second PCB layers to each other to define a PCB assembly having opposite first and second ends and a major surface with an access aperture formed between the first and second ends of the PCB assembly, wherein the optical waveguide array is sandwiched between the first and second PCB layers, with the end faces of the first ends of the optical waveguides being accessible through the access aperture.

Another embodiment of the disclosure is the method described immediately above, and further including: operably disposing an OE-IC on the major surface of the PCB assembly, wherein the OE-IC has an array of OE-IC devices; and moving the waveguide alignment member so that the optical waveguides are optically coupled to the OE-IC devices.

Additional features and advantages are set forth in the Detailed Description that follows, and in part will be apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description explain the principles and operation of the various embodiments. As such, the disclosure will become more fully understood from the following Detailed Description, taken in conjunction with the accompanying Figures, in which:

FIGS. 2A and 2B are close-up side and front-on views of an example waveguide alignment member of the waveguide link assembly of FIG. 1A;

FIG. 3 is a close-up view of a portion of the OE-IC and the OE-PCB of the photonic assembly of FIG. 1D and illustrates an example configuration of the OE-IC;

FIG. 4A is similar to FIG. 1D and illustrates an example wherein the OE-IC devices comprise an array of OE-IC waveguides and showing how a gripping tool is used to grip the waveguide alignment member;

FIGS. 5A through 5E are cross-sectional y-z views similar to FIGS. 1A through 1E and illustrate an example method of forming a photonic assembly that employs an optical interconnector;

FIGS. 11A through 11F are y-z cross-sectional views that illustrate an example method of forming a photonic assembly using an S-shaped optical interconnector;

FIG. 22 is similar to FIGS. 20 and 21, and illustrates an example wherein the waveguide bending structure include a single guide block with a guide channel that supports and guides the front-end sections of the optical waveguides so that the end faces of the optical waveguides reside proximate to and aligned with the end faces of the OE-IC waveguides of the OE-IC;

FIG. 25 shows stacked PCB layers each having waveguide link assemblies pre-fabricated on carrier sheets.

DETAILED DESCRIPTION

Figure 1A:
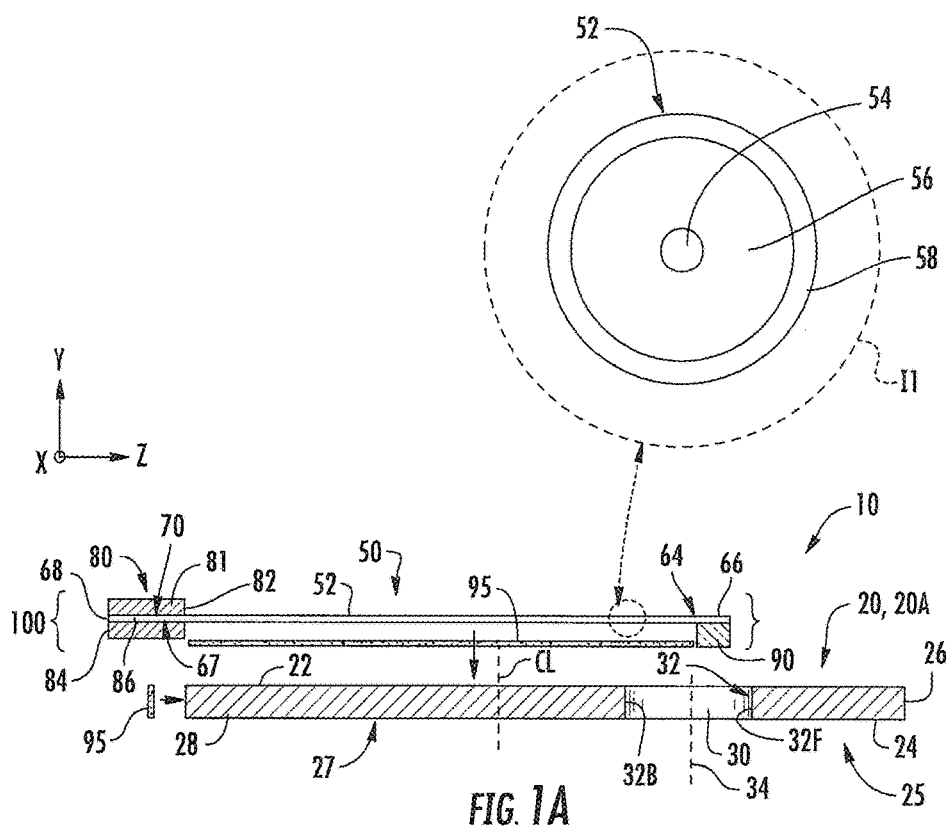
FIGS. 1A through 1C are y-z cross-sectional views illustrating an example method of forming an example OE-PCB as disclosed herein, with FIG. 1A including a close-up inset that shows a cross-sectional view of an example optical waveguide used in the OE-PCB.

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

The term "micron" as used herein means micrometer, i.e., $1\times10^{-6}$ meter, which is abbreviated as "µm" in the art.

The acronym UV stands for ultra-violet.

A "PCB" or a "PCB layer" as these terms are used herein refers to a single printed circuit board that includes electrical components and features such as metal wiring, metal contacts, metal vias, active electrical components such as electrical ICs, etc., not all of which are shown in the Figures for ease of illustration.

The term "PCB assembly" means two or more PCBs or PCB layers operably attached to each other, usually in a layered/laminated configuration.

An "OE-PCB" as the term is used herein is formed from a PCB assembly includes one or more types of optical components, and which in the present disclosure includes one or more arrays of optical waveguides.

An "optical-electrical device" or "OE device" is any device that includes electrical and optical components that provide electrical and optical functionality. Example OE devices include an optical-electrical integrated circuit (OE-IC) and an OE-PCB.

A "photonic integrated circuit" or "PIC" is the same as an OE-IC.

The term "optical interconnection device" or "optical interconnector" means a device that is used to optically couple or optically connect or place in optical communication one OE device with another OE device, and in the present disclosure can be used to optically connect an OE-IC to an OE-PCB. In the examples described below, the optical interconnector can include multiple parts or "sections." Thus, in one example described below, a two-part optical interconnector is constituted by a first optical interconnector section and a second optical interconnector section. In some cases, what constitutes a first or a second optical interconnector section in one example can be used by itself to constitute an entire optical interconnector in another example. A multipart or multi-section optical interconnector can also be referred to as an "optical interconnector assembly."

The term "photonic assembly" as used herein means a device that includes at least two OE devices that are at least optically interconnected, and which can be both optically and electrically interconnected. In examples disclosed below, the photonic assembly is constituted by an OE-IC and an OE-PCB.

The term "waveguide" as used herein means an optical waveguide. Example waveguides can include optical fibers and planar waveguides, which can be fabricated thin flexible glass or polymer layer. It will be apparent from the discussion below that other specific types of waveguides can also be used with the concepts disclosed.

OE-PCB with Embedded Optical Waveguide Array

Figure 1B:
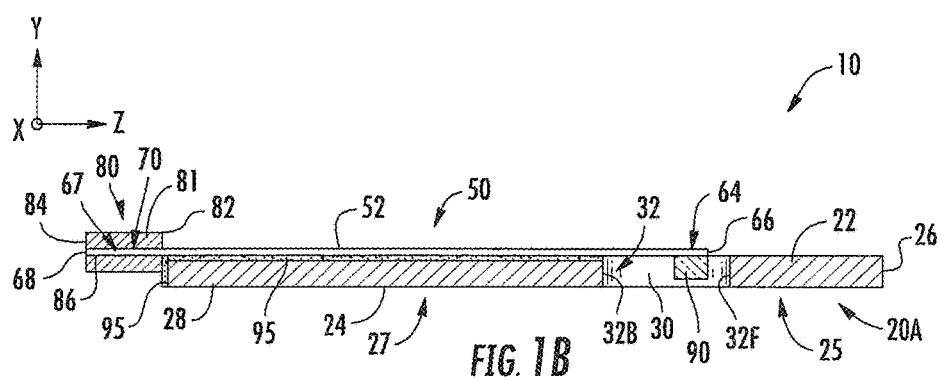
Figure 1C:
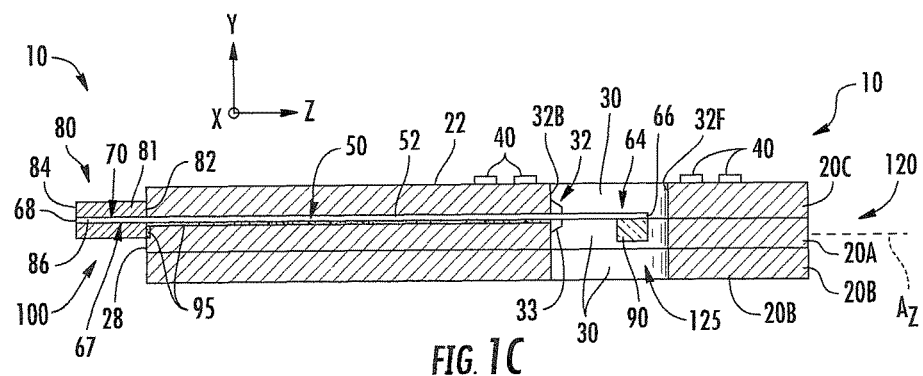

FIGS. 1A through 1C are y-z cross-sectional views illustrating the formation of an example OE-PCB 10 as disclosed herein. FIG. 1A is a partially exploded view that shows a single PCB 20, which will be referred to hereinafter as PCB layer 20A since it will later serve as one of multiple PCBs in a PCB assembly. The PCB layer 20A is also referred to herein as the first PCB layer for reasons that will become apparent in the discussion below.

The PCB layer 20A has a top or major surface 22, a bottom surface 24, a front end 26 and a back end 28. The PCB layer 20A has a centerline CL that runs in the y-direction midway between the front and back ends 26 and 28. The PCB layer 20A has an access aperture ("PCB access aperture") 30 between the top and bottom surfaces 22 and 24. In the present example, the PCB access aperture 30 is located in the PCB layer 20A about mid-way between the centerline CL and the front end 26. Other locations for the PCB access aperture 30 can also be used. The PCB access aperture 30 has an edge 32 and a center 34. The portion of the edge 32 of the PCB access aperture 30 closest to the front end 26 of the PCB is referred to as the front edge 32F while the portion of the edge closest to the back end 28 is referred to as the back edge 32B. The section of the PCB layer 20A between the front end 26 and the front edge 32F of the PCB access aperture defines a front-end section 25 of the PCB layer. Likewise, the section of the PCB layer 20A between the back end 28 and the back edge 32B of the PCB access aperture defines a back-end section 27 of the PCB layer. A layer of securing material 95 is shown residing between the top surface 22 of the PCB layer 20A at the back-end section 27.

FIG. 1A also shows an array 50 of optical waveguides 52 arranged above the top surface 22 of the PCB 20A in anticipation of adding the optical waveguide array to the PCB layer 20A. With reference to the close-up inset I1, each optical waveguide 52 has core 54, a cladding 56 that surrounds the core, and a protective layer 58 that surrounds the cladding. Each optical waveguide 52 also has a front-end section 64 with a front end 66 and a back-end section 67 with a back end 68. In an example, the front end 66 is polished flat and is also referred to herein as the waveguide end face 66.

A ferrule 80 is disposed at or adjacent the back end 28 of the PCB layer 20A and supports the array 50 of optical waveguides 52 at a support location 70 corresponding to back end of the PCB layer 20A. In an example, the ends 68 of the optical waveguides can extend well beyond the back end 84 of the ferrule. The ferrule 80 has a body 81, a front end 82, a back end 84 and bores 86 each sized to accommodate a single optical waveguide 52. Alternatively, the ferrule 80 can have a single elongated bore 86 that supports the entire optical waveguide array.

FIGS. 2A and 2B are close-up side and front-on views of an example waveguide alignment member 90 that supports the front-end sections 64 of the optical waveguides 52 in FIGS. 1A through 1C. The waveguide alignment member 90 includes a top surface 92, a bottom surface 94, a front end 96 and a back end 98. An example of a waveguide alignment member 90 is a V-groove block that includes waveguide V-grooves 93 formed in the top surface 96, as shown in FIG. 2B. The waveguide alignment member 90 may be made of a material that is CTE matched to photonic integrated circuit substrates. For example, if the photonic integrated circuit substrate is made of Si, the waveguide alignment member substrate may be made of a glass that is CTE matched to Si, such as a Pyrex™-like glass. A securing material 95 can be used to secure the front-end sections 64 of the optical waveguides 52 to the waveguide alignment member 90 and in particular in the waveguide V-grooves 93 so that the optical waveguides reside at least partially within respective waveguide V-grooves. In an example, the securing material 95 is a UV-curable adhesive.

The combination of the optical waveguide array 50, the ferrule 80 and the waveguide alignment member 90 constitutes a waveguide link assembly 100. In an example, the waveguide link assembly 100 consists of only optical waveguide array 50 and the ferrule 80. The ends of the waveguide link assembly 100 can be polished prior to subsequent assembly steps.

FIG. 1B shows the waveguide link assembly 100 operably arranged on the top surface 22 of the PCB layer 20A. The layer of securing material 95 is used to secure the optical waveguide array 50 to the top surface 22 of the PCB layer 20A at the back-end section 27. The ferrule 80 is attached to the back end 28 of the PCB also using the securing material 95. The waveguide array 50 is supported on the top surface 22 of the PCB layer 20A such that the front-end sections 64 of the optical waveguides 52 that are held by the waveguide alignment member 90 reside within the PCB access aperture 30.

FIG. 1C shows the structure of FIG. 1B with second and third PCB layers 20B and 20C sandwiching the first PCB layer 20A to define a PCB assembly 120. The PCB assembly 120 can be formed using a standard lamination process as is known in the art. Thus, the OE-PCB 10 comprises the PCB assembly 120 and the waveguide link assembly 100 integrated therewith. In an example, the PCB access apertures 30 of each of the first, second and third PCBs 20A, 20B and 20C are at least partially aligned along their respective centers 34 to define a PCB assembly access aperture ("main aperture") 125. The PCB assembly 120 can have as few as two PCB layers 20. The PCB assembly 120 has a long axis AZ that runs in the z-direction. In an example, the optical waveguide array 50 runs generally in the direction of the long axis AZ and can have some in-plane bends, as described below. During the formation of the OE-PCB 10, protective covers (not shown) can be placed over the ferrules 80 and the waveguide alignment member 90. In an example, a strain-relief feature 33 can be formed on the back edge 32B of the PCB access aperture 30 and over the corresponding portion of the optical waveguides 52 that extend into the PCB access aperture.

The PCB layer 20C, which is also referred to herein as the third or upper PCB layer, includes PCB electrical contacts 40 on the top surface 22 that lead to electrical wiring or electrical vias (not shown). The PCB electrical contacts 40 are shown in FIG. 1C by way of example as residing on opposite sides of the PCB access aperture 30, i.e., adjacent the front end 32F and the back edge 32B.

In other examples, multiple waveguide link assemblies 100 can be integrated with the PCB assembly 120. Also in other examples including those discussed below, the optical waveguides 52 can be sandwiched between the adjacent PCB layers 20A and 20C while also being movable.

Photonic Assembly with Waveguide Bend Section

Figure 1D:
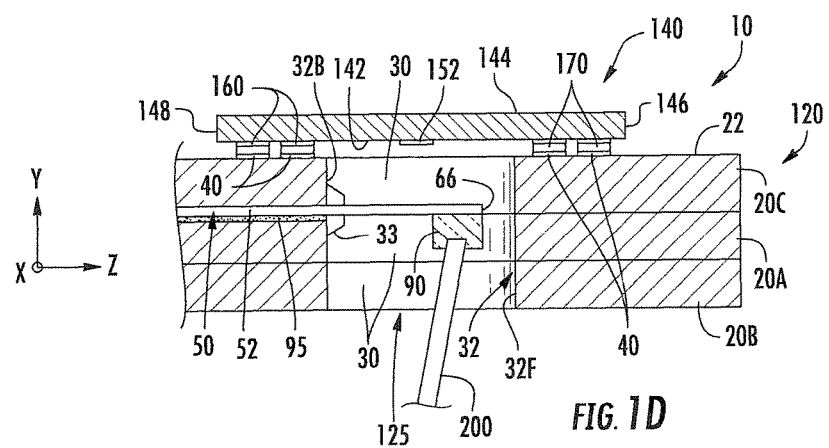
FIG. 1D is similar to FIG. 1C and shows the addition of an OE-IC to the OC-PCB of FIG. 1C as part of the method of forming a photonic assembly.

FIG. 1D is a close-up view that shows a step in the method of forming a photonic assembly 130 whereby a OE-IC 140 is added to the OE-IC 10 of FIG. 1C. FIG. 3 is a close-up view of a portion of the OE-IC 140 and the OE-PCB 10 of the photonic assembly 130 of FIG. 1D and illustrates an example configuration of the OE-IC 140. The OE-IC 140 includes a top surface 142, a bottom surface 144, a front end 146 and a back end 148. The OE-IC 140 supports an array 150 of devices ("OE-IC devices") 152, such as optical transmitters that can transmit light, optical detectors that can detect light, optical transceivers that can both emit and detect light, light-redirecting features (e.g., waveguide grating couplers) that can re-direct light, or waveguides that can transmit light. Thus, the OE-IC devices 52 can be active devices or passive devices. The OE-IC 140 can also include other OE-IC devices 152 besides those shown supported on the top surface 142.

The OE-IC 140 also includes OE-IC electrical contacts 160 on its top surface 142. In the example of FIG. 1D, the OE-IC 140 is arranged over the PCB access aperture 30, with solder bumps 170 used to establish electrical contact between the PCB electrical contacts 40 and the OE-IC electrical contacts 160. Thus, the OE-IC 140 is operably engaged with the PCB assembly 120 in a flip-chip configuration wherein the top surface 142 of the OE-IC 140 faces the top surface 22 of the upper PCB 20C.

When using a flip-chip configuration for the photonic assembly 130, the waveguide link assembly 100 is fabricated from materials that can survive the solder reflow process. In this regard, the protective coating 58 of the optical waveguides 52 can comprise a high-temperature-resistant material, and the waveguide alignment member 90 can be made of glass and joined to the optical waveguide array and the securing material 95 can be an ultra-violet (UV) curable adhesive that is resistant to heat (e.g., Masterbond UV25, available from Masterbond Inc., Hackensack, N.J.).

Figure 1E:
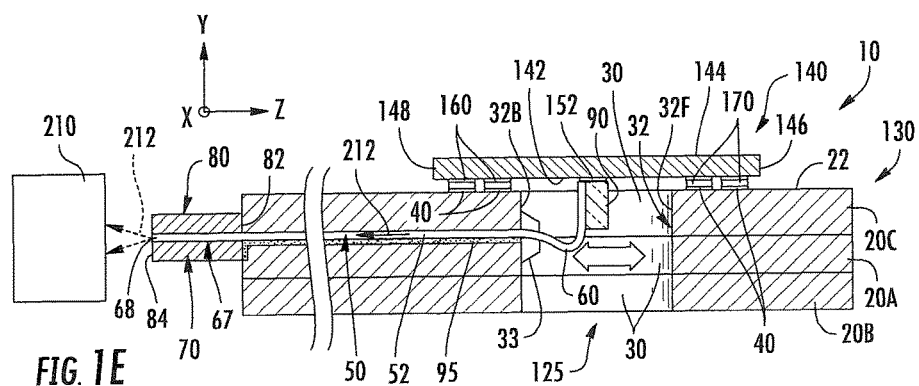
FIG. 1E is similar to FIG. 1D and shows the front-end sections of the optical waveguides of the optical waveguide link being actively aligned with the OE-IC devices of the OE-IC.

FIG. 1D shows a gripping tool 200 inserted into the main aperture 125 and gripping the waveguide alignment member 90. The gripping tool 200 is used to rotate the waveguide alignment member 90 by substantially 90 degrees in the y-z plane, thereby forming respective waveguide bend sections ("bends") 60 in the optical waveguides 52 and aligning and bringing into close proximity the waveguide end faces 66 and the respective OE-IC devices 152, as shown in FIG. 1E. The optical waveguides 52 of the optical waveguide array 50 are configured to sustain tight bends, e.g., with bend radius RB of 2.4 mm for a 125 µm diameter optical waveguide and a bend radius RB of 1.5 mm for a 80 µm diameter optical waveguide. In an example, the bends 60 are substantially right-angle bends. The bends 60 may reside completely within the PCB access apertures 30.

In an example shown in FIG. 1E, an active alignment process is used to accurately align the end faces 66 of the optical waveguides 52 with the OE-IC devices 152 to optimize optical coupling. In an example, this is accomplished by arranging a detector 210 in optical communication with one or more of the optical waveguides 52 at the back ends 68 in the case where the OE-IC devices 152 emit light 212. In this case, the emitted light 212 from the OE-IC devices 152 enters the end face 66 of the one or more optical waveguides 52 and is carried to the detector 210. The optical power of the detected light 212 is monitored to determine the target position of the waveguide alignment member 90 associated with the maximum measured optical power. This active alignment process can also be carried out in reverse, wherein the detector 210 is replaced by a light source that emits the light 212, and the OE-IC device 152 is a detector.

After active alignment of the waveguide alignment member 90 identifies the target position for the waveguide alignment member 90, the waveguide alignment member is fixed in place on the OE-PCB 10 using a securing material (not shown), which can be a UV curable adhesive.

Figure 4B:
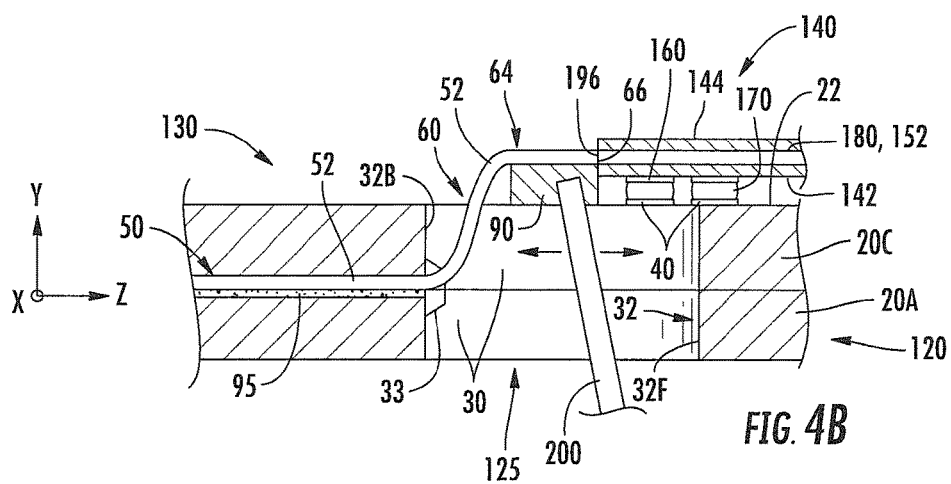
FIG. 4B is similar to FIG. 4A and shows how the gripping tool is used to form an S-bend in the optical waveguides so that the optical waveguides align with the OE-IC waveguides.

FIG. 4A illustrates an example wherein the OE-IC devices 152 comprise an array 180 of OE-IC waveguides 182, which can also be referred to as optical interconnection waveguides. Each OE-IC waveguide 182 has an end face 196, which in the present example is located at the front end 146 of the OE-IC. In the example of FIG. 4A, the OE-IC 140 is located off center of the PCB access apertures 30 towards the front end 26 of the upper PCB 20C. In FIG. 4A, the gripping tool 200 is used to grip the waveguide alignment member 90 to create an S-bend 60 in each optical waveguide 52 as shown in FIG. 4B. While the gripping tool 200 is shown gripping the waveguide alignment member 90 through the PCB access apertures 30 from below, it could also grip the waveguide alignment member 90 from above. In this case, the PCB layer 20B would not need to have a PCB access aperture 30, in which case the PCB access apertures 30 of the PCB layers 20C and 20A define a blind access aperture in the PCB assembly 120.

FIG. 4B shows how the S-bends 60 are used to place the waveguide end faces 66 of each optical waveguide 52 proximate to and in at least coarse alignment with corresponding end faces 196 of the OE-IC waveguides 180. Active alignment can then be carried out in the same or similar manner as described above to establish the target position for the waveguide alignment block 90. Once the target position is determined, the waveguide alignment block 90 is then secured (e.g., using UV-curable adhesive) to the OE-IC 140, e.g., on the top surface 22 of the upper PCB 20C.

Figure 4C:
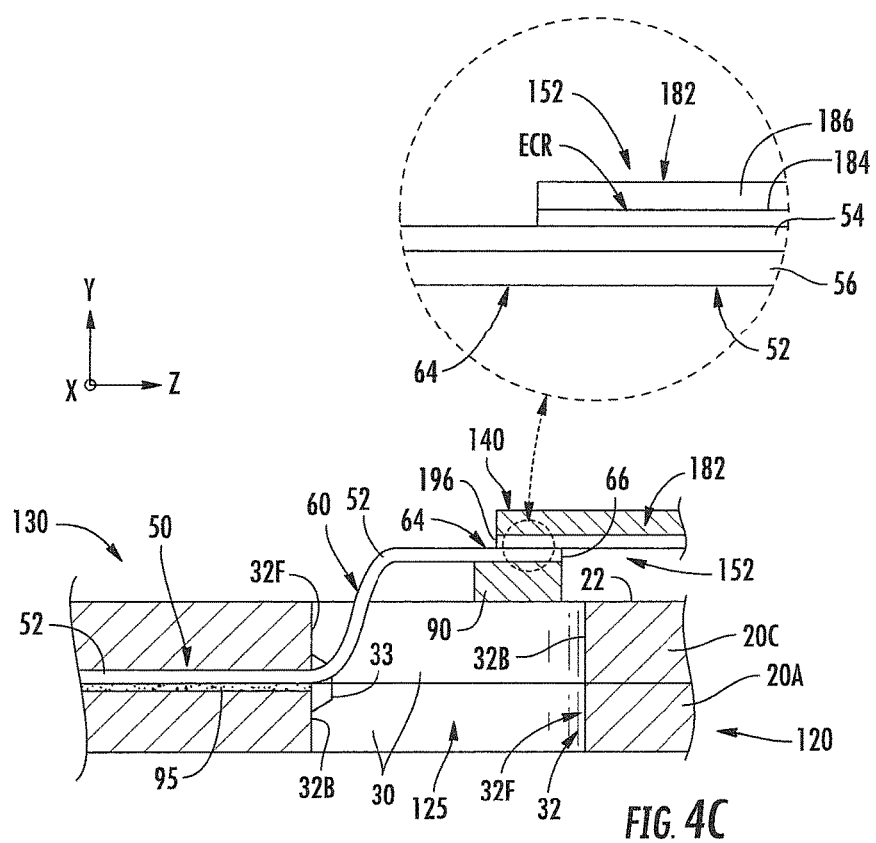
FIG. 4C is a close-up view of the central portion of the photonic assembly of FIG. 4B and shows in more detail how the S-bends in the optical waveguides are used to place the waveguide end faces of each optical waveguide proximate to and in at least coarse alignment with corresponding end faces of the OE-IC waveguides.

FIG. 4C is similar to FIG. 4B and illustrates an example wherein evanescent coupling is used to optically couple the optical waveguides 52 to the OE-IC waveguides 180. In this example, each waveguides 180 has a core 184 and a cladding 186 that surrounds the core, as best seen in the close-up inset of FIG. 4C. A portion of the cores 54 of the optical waveguides 52 are exposed by removing their cladding layer 56 or by only have a very thin cladding layer, as show in in the close-up inset. Likewise, a portion of the cores 184 of the OE-IC waveguides 182 are exposed or have a very thin cladding layer 186. The optical waveguides 52 are then contacted with corresponding OE-IC waveguides 182 at the front end of the OE-IC 140 an in an overlapping manner so that evanescent coupling can occur between the respective exposed cores 54 and 184 over an evanescent coupling region ECR.

Photonic Assembly with L-Shaped Optical Interconnector

Figure 5D:
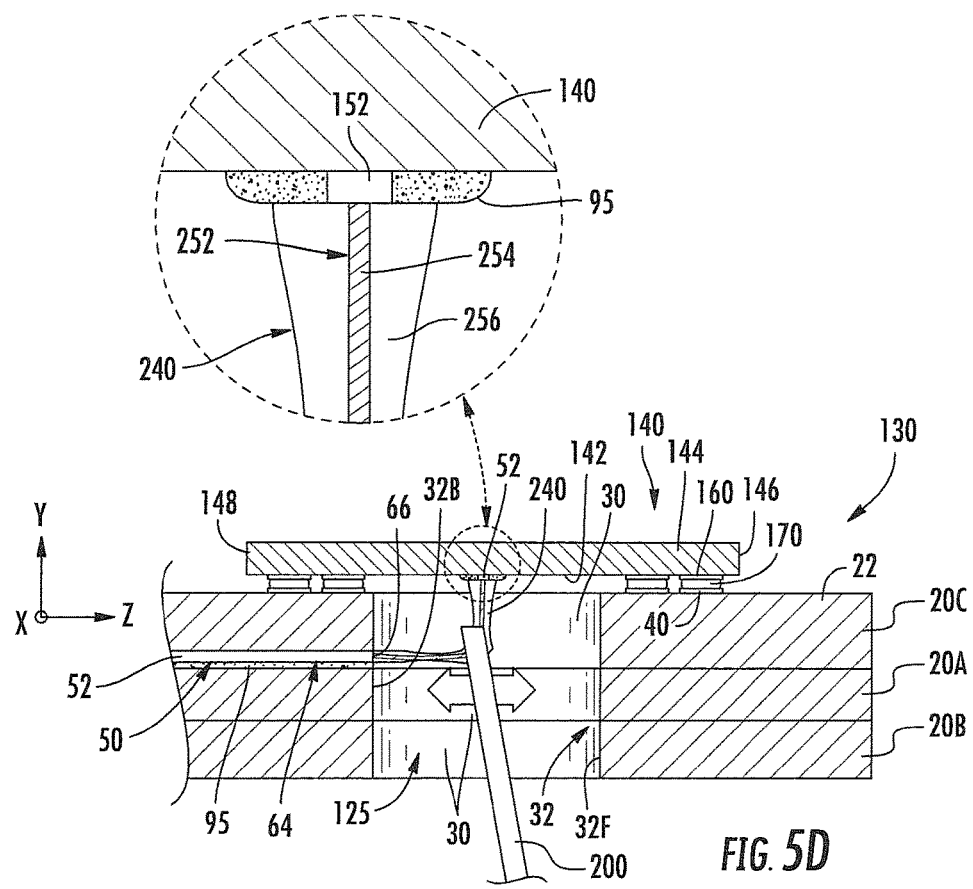

FIGS. 5A through 5E are cross-sectional y-z views similar to FIGS. 1A through 1E and illustrate an example embodiment of forming a photonic assembly 130 that employs an optical interconnector 240 operably disposed between the OE-IC devices 152 of the OE-IC 140 and the optical waveguides 152 of the PCB assembly 120. FIGS. 5A and 5B show an example waveguide link assembly 100 where the optical waveguide array 50 terminates at the back edge 32B of the PCB access aperture 30 of the PCB 20A. Also, the ferrule 80 includes an array 280 of ferrule waveguides 282 defined by a core 284 surrounded by a cladding 286 made up of the ferrule body 81, which in an example comprises glass. The core 284 can be formed within (i.e., buried within) the ferrule body 81, e.g., by laser writing. Each ferrule waveguide 282 has a front end 296 and a back end 298. The back ends 68 of the optical waveguides 52 terminate at the front ends 296 of the ferrule waveguides 282 while the front ends or end faces 66 of the optical waveguides terminate at the back edge 32B of the PCB access aperture 30.

The ferrule 80 can be fabricated by first coarsely aligning and then attaching a "blank" ferrule (i.e., one without ferrule waveguides 282) to the back end 28 of the PLC 20 and to the back end 68 of the optical waveguides 52 of the optical waveguide array. Then, the array 280 of ferrule waveguides 282 can be formed (e.g., by laser writing) so that the front ends 296 of the ferrule waveguides match the locations of the back ends 68 of the optical waveguides 52 while the back ends 298 of the ferrule waveguides match the locations of the front ends or end faces 66 of a second optical waveguide array 50 of optical waveguides 52 that are optionally aligned in a ferrule external to the OE-PCB 10.

Thus, laser writing of the ferrule waveguides 282 in the ferrule 80 can be performed as part of the fabrication method to ensure proper alignment of the array 280 of ferrule waveguides with the array 50 of optical waveguides 52. It is noted here that an advantage of laser writing to form waveguides in glass material is that the formation of the waveguide cores does not require adding any new glass or any other type of material to the existing glass material. Rather, the laser writing process locally increases the glass density and thus the refractive index of the glass to define the core while the surrounding glass defines the cladding This allows for ferrule 80 as well as other glass components disclosed herein to have a monolithic structure while also supporting an array 280 of waveguides 282.

Figure 6:
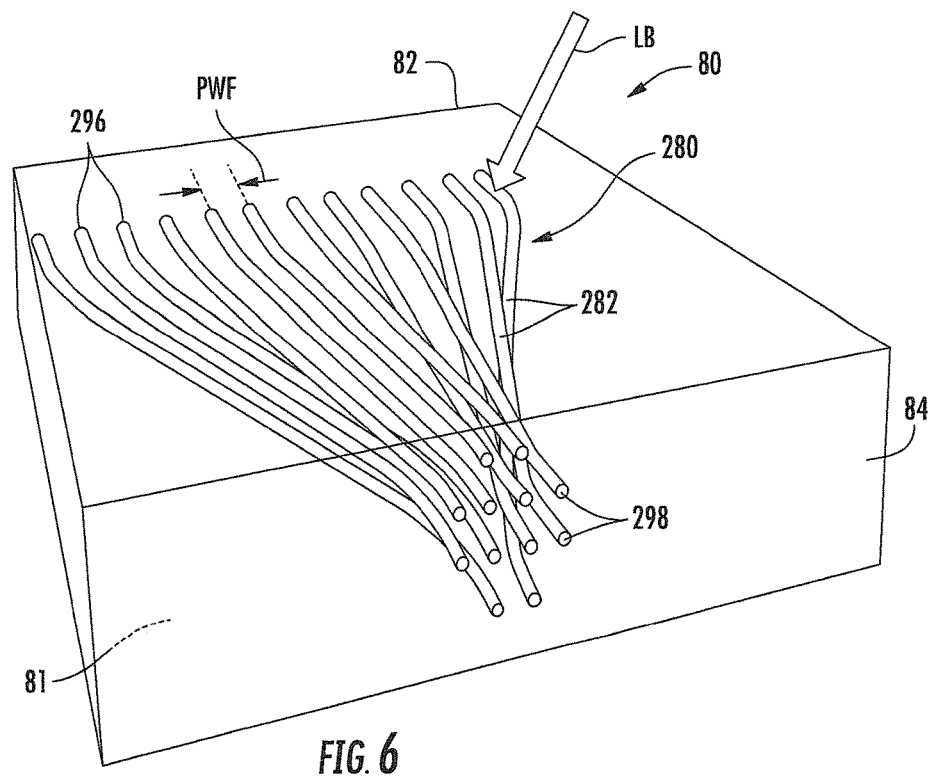
FIG. 6 is a back-end elevated view of an example ferrule showing an example of an array of ferrule waveguides formed within ferrule body using a laser writing process.

FIG. 6 is a back-end elevated view of an example ferrule 80 showing an example of an array 280 of ferrule waveguides 282 formed within the body 81 of the ferrule using a laser writing process with a laser beam LB. Note that the second optical waveguide array 50 external to the OE-IC 10 need not have a select pitch and in fact the optical waveguides 52 therein can be arbitrarily arranged. Note also how the front ends 296 of the ferrule waveguides 282 can be formed to have a select pitch PWF and reside in a single plane to correspond to the configuration of the array 50 of optical waveguides 52 integrated into the PCB assembly 120 of the OE-IC 10.

It is also noted that the end faces 66 of the optical waveguides 52 of the optical waveguide array 50 that reside proximate the front edge 32F of the PCB access aperture 30 can be processed in situ, e.g., by mechanical polishing (e.g., with a diamond saw) or by laser polishing (e.g., with a $CO_2$ laser) using the PCB access apertures 30 as an access aperture.

FIG. 5C is similar to FIG. 1C and shows the OE-IC 140 disposed on the upper PCB 20C of the PCB assembly 120 over the PCB access apertures 30.

Figure 7A:
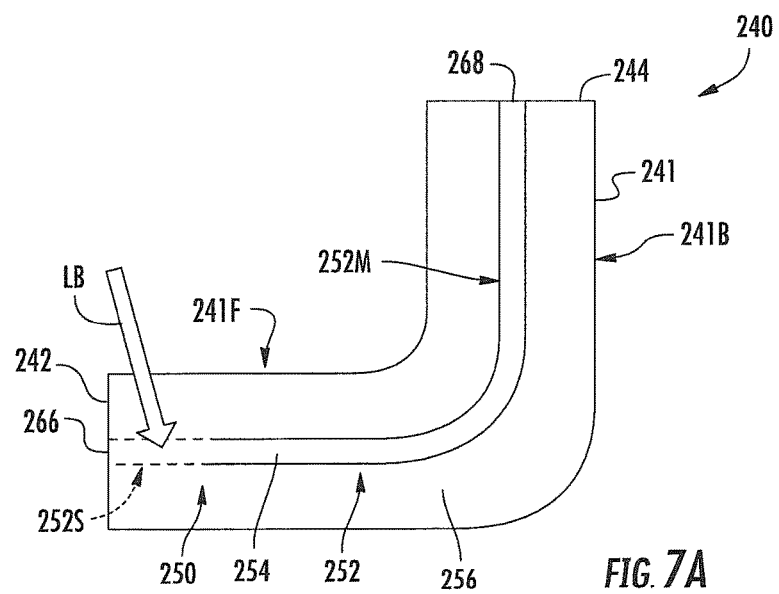
FIGS. 7A and 7B is are close-up side views of two example optical interconnectors each having an L-shape.

FIG. 5D is similar to FIG. 5C and is a close-up view that shows the addition of the optical interconnector 240 operably disposed within the PCB access apertures 30. FIG. 7A is a close-up side view of an example optical interconnector 240. The optical interconnector 240 includes a body 241 with a front end 242, a back end 244 and an outer surface 240. The body 241 is shown by way of example as being L-shaped and thus having front and back sections 241F and 241B that respectively include the front and back ends 242 and 244 and that are at right angles to each other. Other shapes of body 241 can be used, as discussed below. The L-shape of the optical interconnector 240 also results in the front end 242 and the back end 244 residing in substantially perpendicular planes (i.e., the front end 242 in an x-y plane and the back end 242 in an x-z plane).

In an example, the optical interconnector 240 is a waveguide-based light-redirecting element that includes an array 250 of waveguides 252. Each waveguide 252 is defined by a core 254 formed in the body 241, wherein the portion of the body that surrounds the core defines a cladding 256. In an example, the waveguides 252 are formed using a laser writing process (e.g., using femtosecond laser pulses) that defines the cores 254. Each waveguide 252 has a front end or front end face 266 and a back end or back end face 268. In an example, the body 241 of the optical interconnector is made of glass and can be formed using a glass re-draw process. In an example, the main sections 252M of waveguides 252 are prewritten except for small end sections 252S adjacent the front end 242 and/or the back end 244 (dashed lines), which can be laser written after the optical interconnector 240 is operably disposed within the photonic assembly 130. An advantage of the L-shape is that the front and back sections 241F and 241B can be made sufficiently thin in the directions perpendicular to the waveguides 252 so that they are flexible in the y-z plane and thus be more easily aligned within the OE-PCB 10 and the OE-IC 240.

Figure 7B:
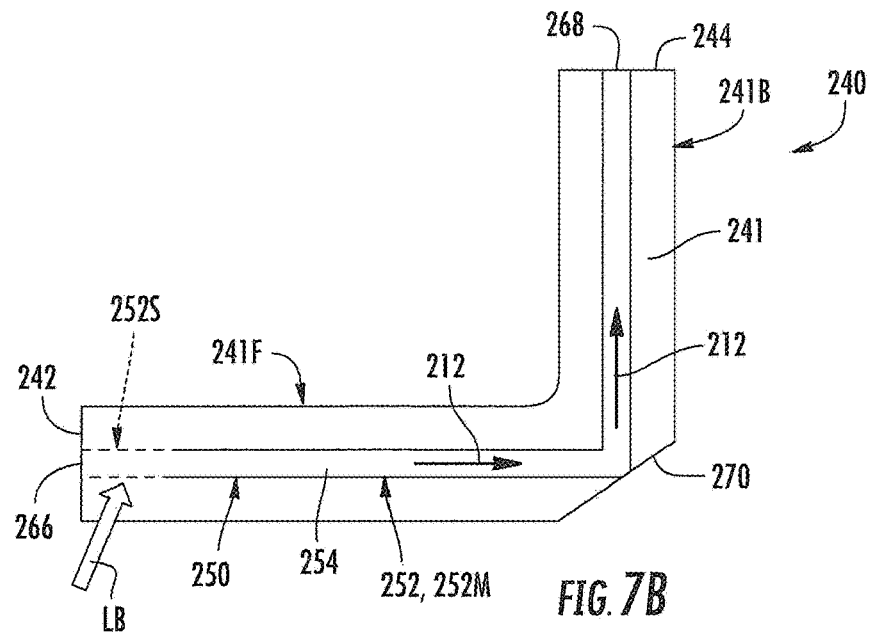

FIG. 7B is similar to FIG. 7A and shows an example configuration for the L-shaped optical interconnector 240 that includes a TIR surface 270, which redirects light 212 traveling in the +z direction with the waveguides 252 to travel in the y-direction, or that redirects light traveling in the −y direction to travel in the −z direction. Thus, light 212 emitted from an OE-IC device 52 in the −y direction can be redirected to travel in a direction parallel to the plane of the top surface 22 of the upper PCB, i.e., in the −z direction.

Figure 7C:
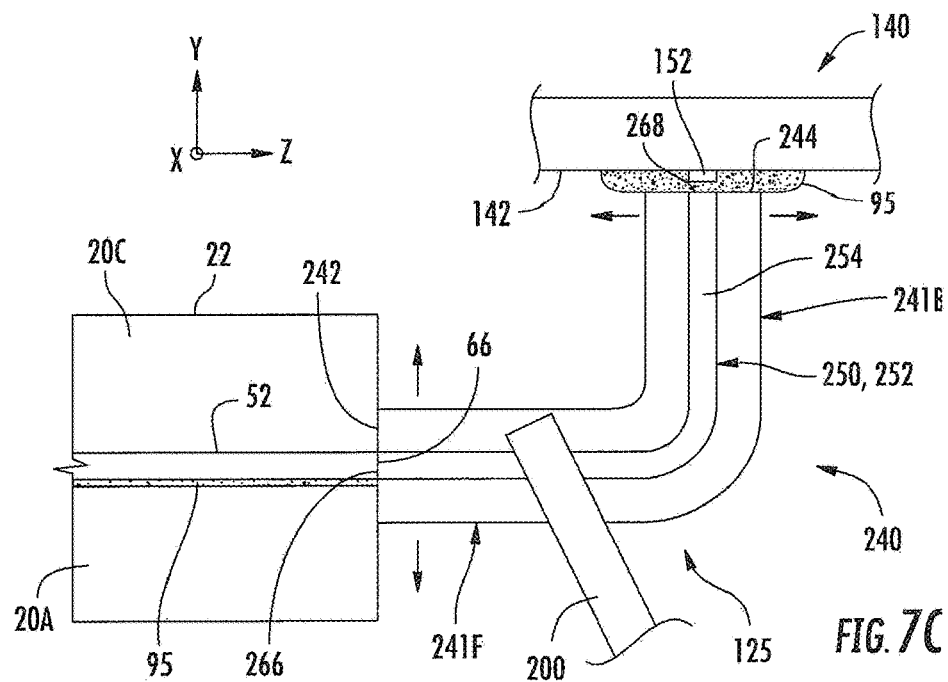
FIG. 7C is a close-up cross-sectional view showing the L-shaped optical interconnector of FIG. 7A disposed relative to the OE-PCB and the OE-IC so that the optical interconnector waveguides optically couple the optical waveguides of the OE-PCB with the OE-IC devices of the OE-IC.

With reference again to FIG. 5D, the optical interconnector 240 is inserted into the main aperture 30 of the PCB assembly 120 using a gripping tool 200 and then at least coarsely aligned with the optical waveguide array 50 integrated with the PCB assembly 120. As shown in the close-up view of FIG. 7C, this coarse alignment step places the front end 242 of the optical interconnector 240 and thus the front ends 266 of the waveguides 252 therein proximate to and substantially aligned with the end faces 66 of the optical waveguides 52 and the back end 244 of the optical interconnector and thus the back ends 268 of the waveguides therein proximate to and substantially aligned with the OE-IC devices 152 of the OE-IC 140.

Active alignment is then performed to determine the target position of the optical interconnector 240 relative to the OE-IC devices 152 of the OE-IC 140. Once the target position is determined, the optical interconnector 240 is secured in the target position in the OE-IC 10 using securing material 95. Then, the exact positions of the waveguide end faces 66 of the optical waveguides 52 supported in the PCB assembly 120 are determined via, for example, machine vision and image processing techniques. The optical connection is then completed by laser writing the waveguide sections 252S (see FIG. 7A) with a laser beam LB so that the front ends 266 of the waveguides 252 formed within the body of the optical interconnector 240 align with the waveguide end faces 66 of the optical waveguides 52. This process has the advantage that the various glass components are bonded prior to final optical alignment so that unwanted lateral shifts that may occur during curing of the securing material 95 may be avoided. The flexibility of the front and back sections 241F and 241B of the optical interconnector 240 can accommodate modest mechanical shifts due to mismatches in the coefficient of thermal expansion (CTE) between the OE-IC 140, the solder bumps 170, and the PCB assembly 120.

Figure 5E:
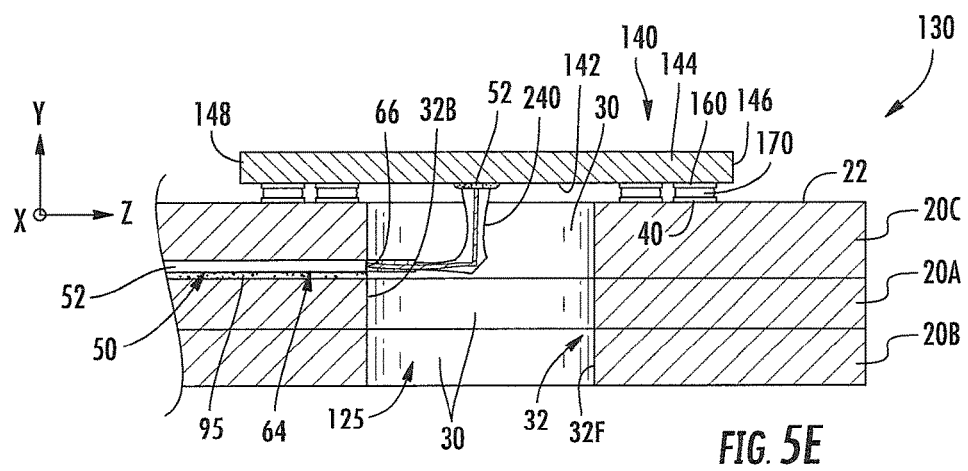

In another example, the array 250 of waveguides 252 of the optical interconnector 240 are pre-written in their entirety and then active alignment of the optical interconnector 240 is carried out by transmitting light between the active elements 152 and the optical waveguides 52 through the optical interconnector to determine the target position. Once the target position for the optical interconnector is determined, it is then securing within the photonic assembly 130. In an example, the flexibility of the front and back sections 241F and 241B of the optical interconnector 240 is exploited in the alignment process. FIG. 5E shows the resulting photonic assembly 130.

Photonic Assembly with S-Shaped Optical Interconnector

Figure 8A:
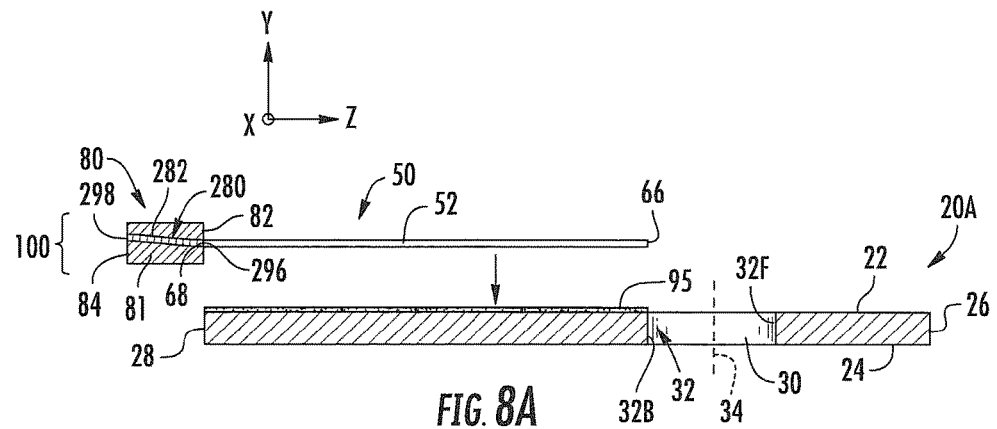
FIGS. 8A through 8E are similar to FIGS. 5A through 5E and illustrate another example method of forming a photonic assembly using an S-shaped optical interconnector.
Figure 8B:
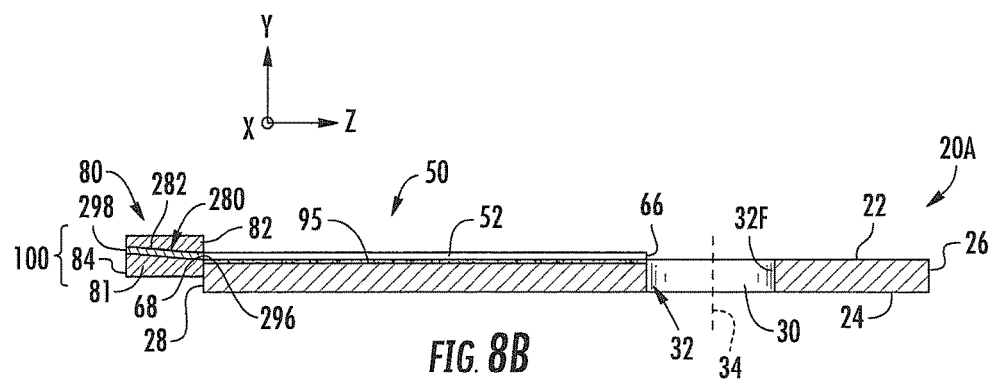
Figure 8C:
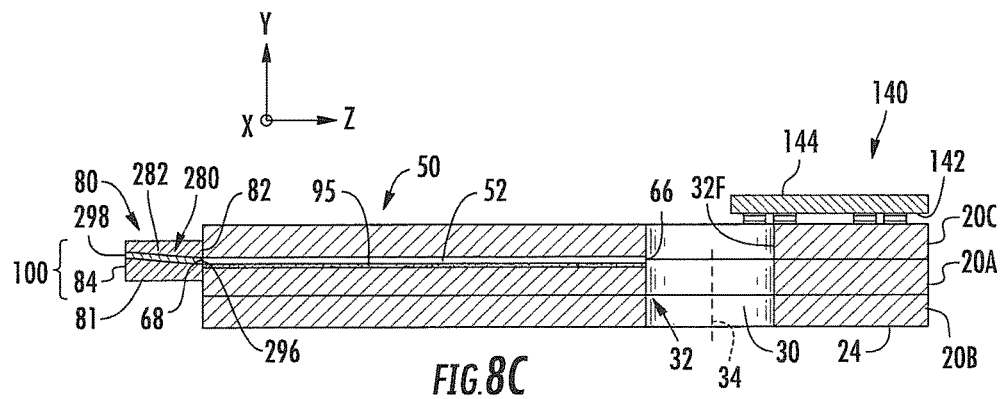

FIGS. 8A through 8E are similar to FIGS. 5A through 5E and illustrate another example of forming a photonic assembly 130 using an optical interconnector 240. FIGS. 8A through 8C show the waveguide link assembly 100 being incorporated into the PCB assembly 120, with FIG. 8C showing the OE-IC 140 located off center of the PCB access apertures 30 towards the front end 26 of the upper PCB 20C. This location of the OE-IC 140 relative to the PCB facilitates high density PCB routing of electrical leads to more solder bump locations.

Figure 8D:
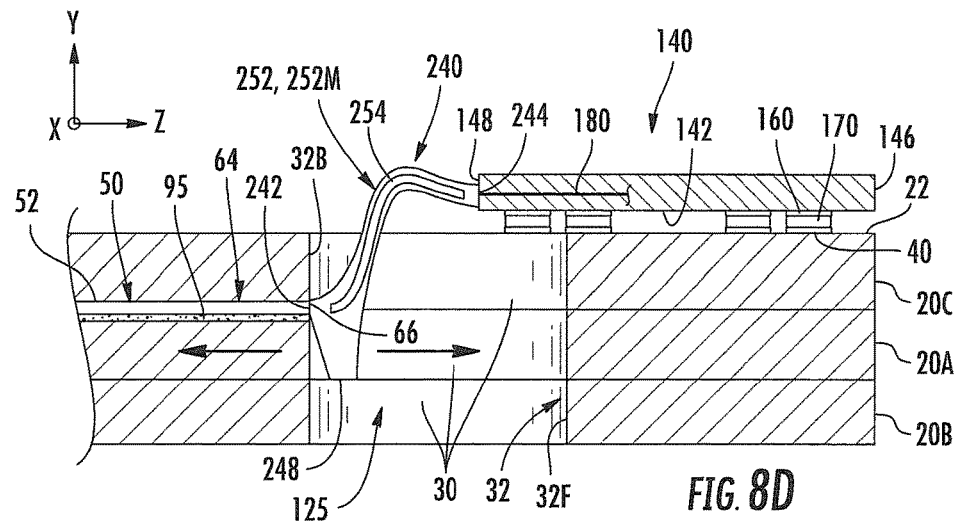
Figure 9:
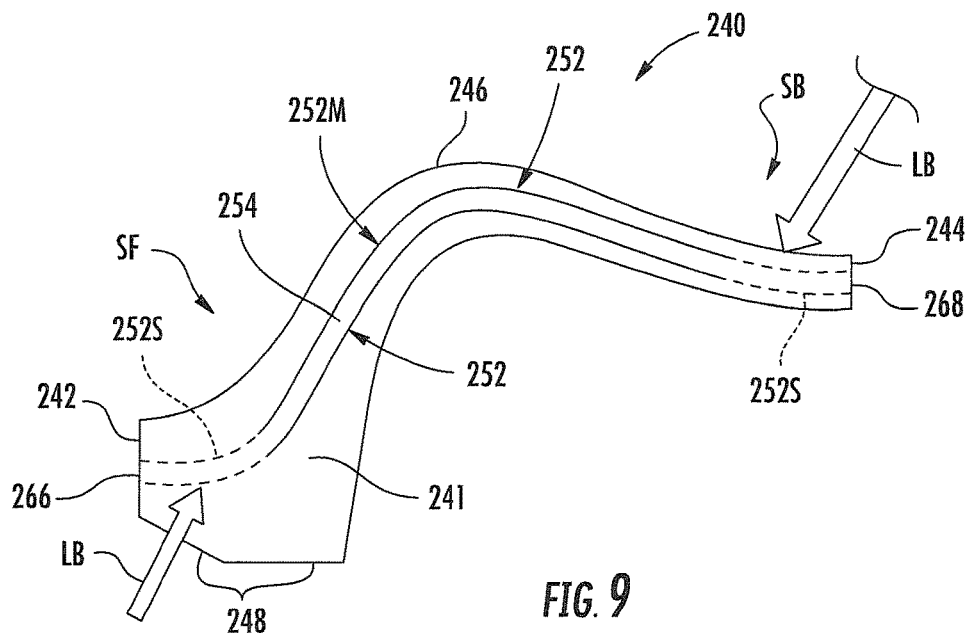
FIG. 9 is a close-up side view of the example S-shaped optical interconnector of FIGS. 8A through 8E.

FIG. 8D is a close-up view that shows the optical interconnector 240 operably disposed within the PCB assembly 120 of the OE-IC 10. The optical interconnector 240 optically couples the optical waveguide array 250 integrated with the PCB assembly 120 with the OE-IC devices 152 in the form of the waveguide array 180 supported by the OE-IC 140. FIG. 9 is a close-up side view of an example optical interconnector 240 wherein the body 241 has an S-shape rather than an L shape and has a front-end section SF that includes the front end 242 and a back-end section SF that includes the back end 244. The S-shape is such that the front end 242 and back end 244 reside in substantially parallel x-y planes. The S-bend shape of the body 241 of the optical interconnector 240 can be created using a glass redraw process. The S-bend shape provides the optical interconnector 240 with some flexibility in the front and back ends SF and SB that accommodates motion of the optical interconnector during coarse alignment and attachment to the PCB assembly 120 as well as to the OE-IC 14, or motion caused by stresses induced by components of the photonic assembly 130 having substantially different CTEs.

In an example, the outer surface 246 of the optical interconnector 240 includes flat sections 248 through which a laser beam LB can be directed for laser writing the cores 254 in the body 241 to define the waveguides 252. As in the previous example, the waveguides 252 can be prewritten except for short sections 252S near the front and/or back ends 242 and 244 that can be written after the optical interconnector 240 is secured within the PCB assembly 120 at its target position.

Figure 8E:
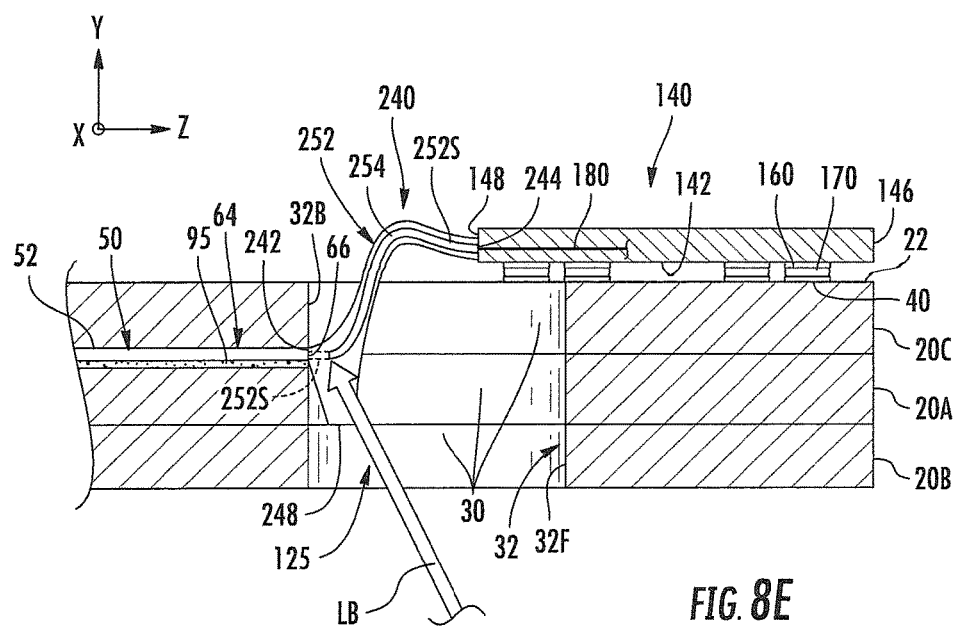

The optical interconnector 240 is disposed at least partially within the PCB access apertures 30 such that the front ends 266 of the waveguides 252 are proximate to and at least coarsely aligned with the end faces 66 of the optical waveguides 52 of the optical waveguide array integrated with the PCB assembly 120. Likewise, the back ends 268 of the waveguides 252 are proximate to and at least coarsely aligned with the end faces 196 of the OE-IC waveguides 180 supported by the OE-IC 140. The close-up view of FIG. 8E shows the laser beam LB laser writing the ferrule waveguides 280 in ferrule body 81 for optical connection to the external array 50 of optical waveguides 52 disposed adjacent the back end 84 of the ferrule 80.

Photonic Assembly Fabrication Method with L-Shaped Optical Interconnector

In the fabrication methods for the photonic assembly 130 discussed above, the optical interconnector 240 was aligned with and secured to the OE-IC 140 and the OE-PCB 10 after the OE-IC was added to the PCB assembly 120 in the flip-chip configuration.

Figure 10A:
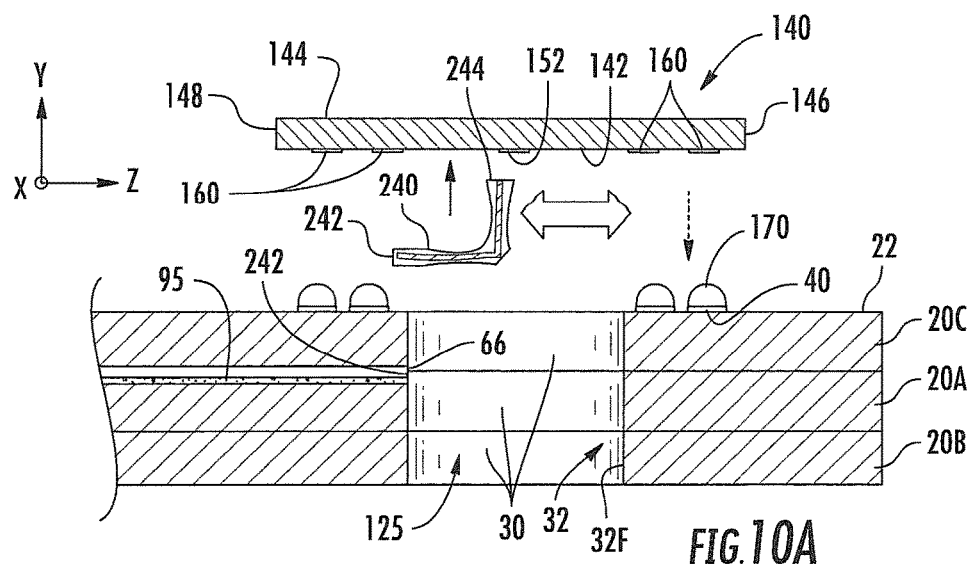
FIGS. 10A through 10C are y-z cross-sectional views that illustrate an alternate method of forming a photonic assembly using an optical interconnector wherein the optical interconnector is first attached to the OE-IC and then the combined OE-IC and optical interconnector are attached to the OE-PCB.
Figure 10B:
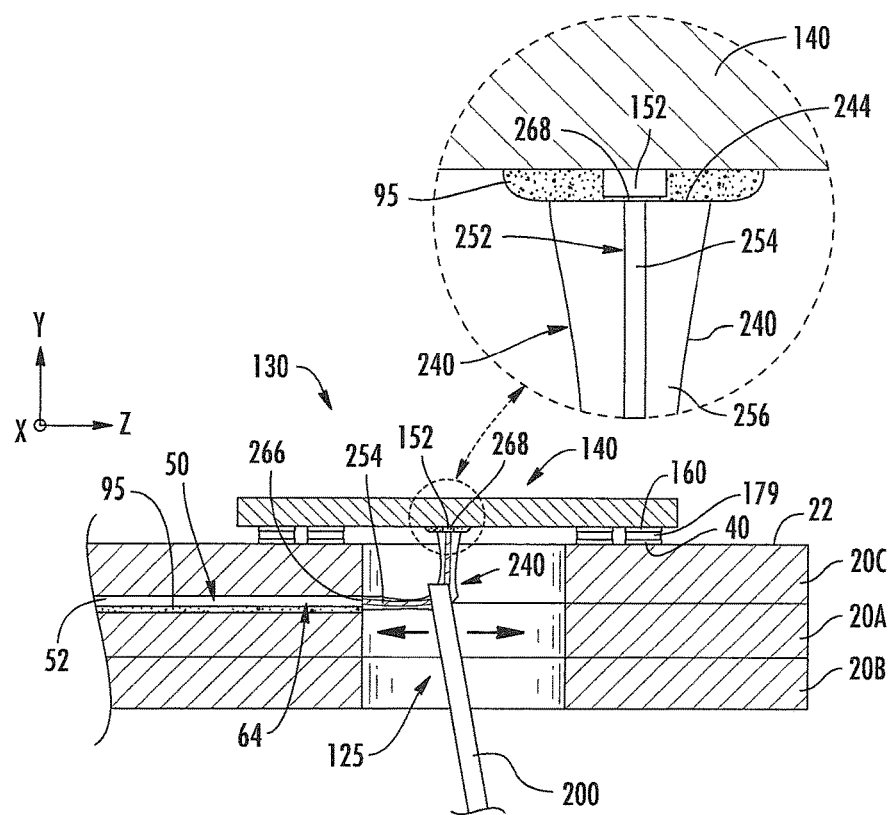
Figure 10C:
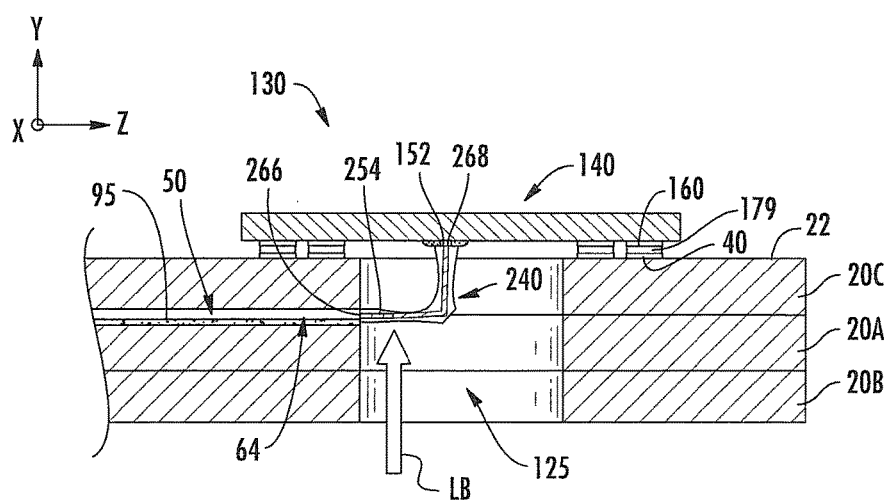

An alternate fabrication method involves operably aligning and securing the optical interconnector 240 to the OE-IC 140 prior to adding the OE-IC to the PCB assembly 120. FIGS. 10A through 10C are cross-sectional views that illustrate this alternate fabrication method. FIG. 10A is similar to FIGS. 5C and 5D and shows the optical interconnector 240 being aligned and secured to the OE-IC 140 before the OE-IC 140 is added to the OE-PCB 10. In this step, active alignment of the optical interconnector 240 relative to the OE-IC 140 is readily carried out by directing light 212 through one or more waveguides 252 of the optical interconnector either into the back end 268 from one or more active elements 152 or into the front end 266 using the light source 210. Once the target position of the optical interconnector 240 is determined, it is then secured to the OE-IC 140 using securing material 95, such as a UV-curable adhesive.

At this point, the OE-IC 140 and the optical interconnector 240 secured thereto is added to the OE-PCB in a flip-chip configuration, as illustrated in FIGS. 10B and 10C. At this point, the gripper tool 200 can be inserted through the PCB access apertures 30 from below to grasp the free (unattached) front section 241F of the optical interconnector 240 and at least coarsely align the front ends 266 of the waveguides 252 with the end faces 66 of the optical waveguides 52 of the optical waveguide array 50 of the OE-PCB 10.

If the waveguides 252 of the optical interconnector 240 have been pre-written in their entirety, then active alignment is once again performed with respect to the optical waveguides 52 and the optical interconnector secured in its target position as described above. If the waveguides 252 of the optical interconnector 240 have not been pre-written in their entirety, then the optical interconnector can be secured in its coarse alignment position and the remaining sections 252S of the waveguides 252 written in a manner that achieves fine alignment with the optical waveguides 52 of the optical waveguide array 50 of the OE-PCB 120 as discussed above and as shown in FIG. 10C.

Photonic Assembly Fabrication Method with S-Shaped Optical Interconnector

Another fabrication method for the photonic assembly 130 disclosed herein is similar to that employed above for the L-shaped optical interconnector 240 but for the S-shaped optical interconnector.

Figure 11A:
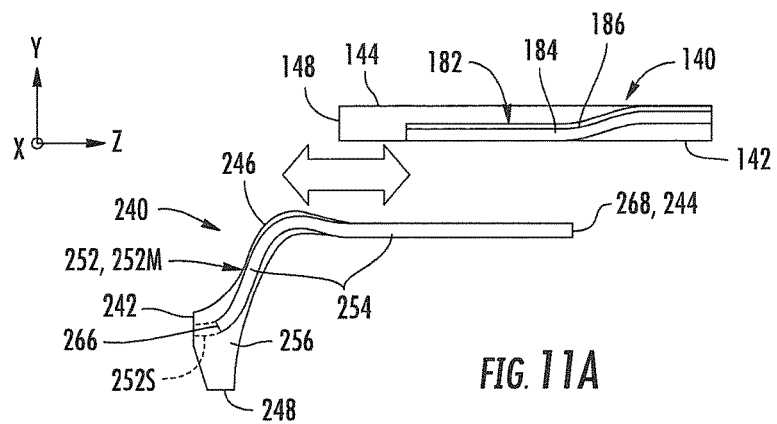
Figure 11B:
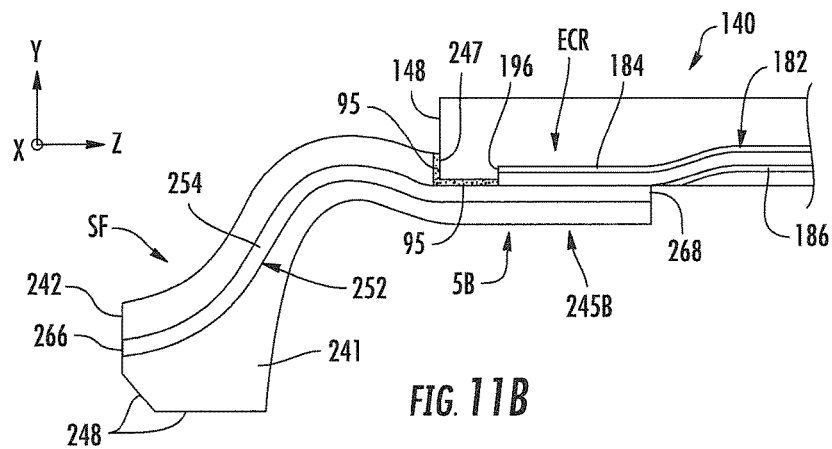

FIG. 11A shows the S-shaped optical interconnector 240 in the process of being operably attached to the OE-IC 140. FIG. 11B is a close-up view of an example S-shaped optical interconnector 240 that shows the waveguides 252 of the optical interconnector 240 and the OE-IC waveguides 182 supported by the OE-IC 140. In the example, the cores 254 of the waveguides 252 reside very close to or at the outer surface 246 near the back end 244 of the optical interconnector 240 and define a flat back-end section 245B. Likewise, the cores 184 of the OE-IC waveguides 180 are exposed or are covered by a very thin cladding 186. The cores 184 of the OE-IC waveguides 180 overlap the cores 254 of the waveguides 252 of the optical interconnector to define an evanescent coupling region ECR where light 212 traveling in one core can evanescently couple into the other core.

Active alignment can be employed to establish the target position for the optical interconnector 240 relative to the OE-IC 140 to optimize the evanescent coupling efficiency in the evanescent coupling region ECR. In an alternate embodiment such as discussed above in connection with FIGS. 8D and 8E, the S-shaped optical interconnector 240 can be used to establish edge coupling between the front ends 266 of the waveguides 252 and the front ends 196 of the OE-IC waveguides 180.

Figure 11C:
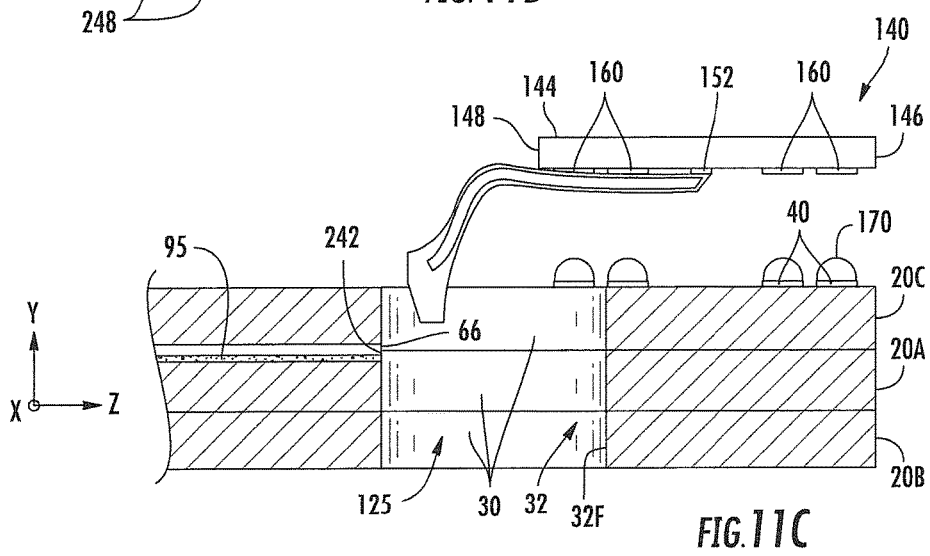

Once active alignment has been performed, then with reference to FIG. 11C, the optical interconnector 240 is secured to the OE-IC 140 using for example a UV-curable adhesive. The flat back-end section 245B, besides defining the evanescent coupling region ECR, also provides mechanical stability of assembly defined by the OE-IC 140 and the optical interconnector 140 secured thereto. In an example, the back flat-end section 245B is defined in part by a small step 247 that engages the front end 146 of the OE-IC 140 and that provides additional mechanical stability while also assisting in defining a select length for the evanescent coupling region ECR.

FIGS. 11D and 11E show the OE-IC 140 and the optical interconnector 240 in the process of being aligned and secured to the OE-PCB 10 a flip-chip configuration to form the photonic assembly 130. With reference to FIG. 11D, the gripper tool 200 can be inserted through the PCB access apertures 30 from below to grasp the optical interconnector 240 near the loose front end 242 and at least coarsely align the front ends 266 of the waveguides 252 with the end faces 66 of the optical waveguides 52 of the optical waveguide array 50 of the OE PCB 10.

If the waveguides 252 of the optical interconnector 240 have been pre-written in their entirety, then active alignment is once again performed with respect to the optical waveguides 52 and the optical interconnector secured in its target position as described above. If the waveguides 252 of the optical interconnector 240 have not been pre-written in their entirety, then the optical interconnector can be secured in its coarse alignment position and the remaining sections 252S of the waveguides 252 written in a manner that achieves fine alignment with the optical waveguides 52 of the optical waveguide array 50, as discussed above and as shown in FIG. 9E.

In an example, the sections 252S of the waveguides 252 can be formed in the back flat-end section 245B of the optical interconnector 240 after attaching the optical interconnector to the OE-IC 140 to ensure optical alignment.

In an example where edge coupling to the OE-IC 140 is required, then with reference to the close-up view of FIG. 11F, the back ends 268 of the waveguides terminate at the step 247 at a fixed distance above the flat back-end portion 245B. This fixed distance is selected to correspond to the vertical distance between the bottom surface 144 of the OE-IC 140 and the optical center of the OE-IC waveguides 182.

In an example, the optical interconnectors 240 are formed of glass using a precision redraw process. The optical interconnectors 240 can also be formed to have shapes other than the L-shapes and S-shaped discussed above, and can be formed using other forming processes. In an example, the outer surface 246 of the optical interconnectors 240 can flat sections to simplify accurate placement of laser written waveguide within the parts. In one example, the optical interconnectors 240 can be formed from flexible thin glass sheets created by fusion draw processes. The curved bend profiles can be formed in the thin glass sheet by pressing processes over a curved mold, or by heating a portion of the sheet (using, for example, a $CO_2$ laser) followed by mechanical bending of the sheet. Alternatively, the curved glass bend profiles can be created via sheet flexure during installation of optical interconnector 240 on the OE-PCB 10.

Photonic Assembly with Waveguide Bend Support Structure

In the embodiments of the photonic assembly discussed above, the optical waveguide array 50 is supported in an x-z plane sandwiched between adjacent PCBs 20 of the PCB assembly 120. In this configuration, the end faces 66 of the optical waveguides 52 reside in an x-y plane.

Figure 12A:
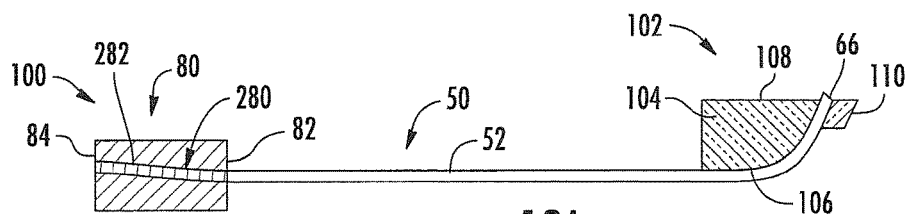
FIGS. 12A through 12C illustrate an example OE-PCB that utilizes a modified waveguide link assembly that includes a waveguide bending structure.
Figure 12B:
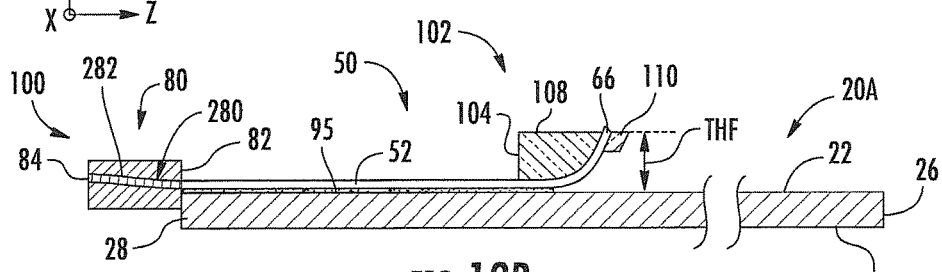
Figure 12C:
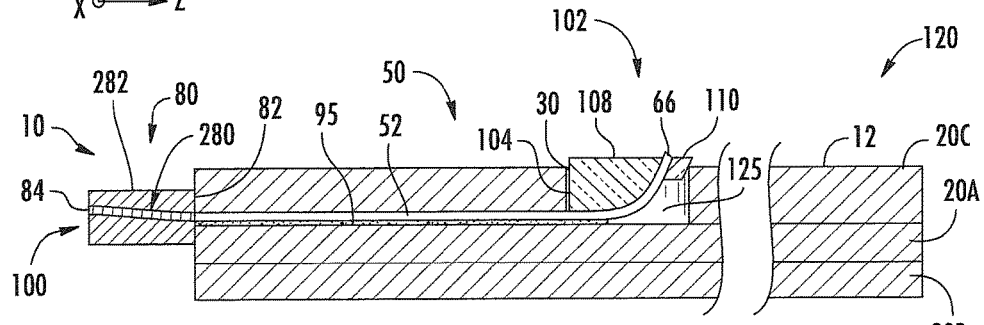

FIGS. 12A through 12C illustrate an example OE-PCB 10 that utilizes a modified waveguide link assembly 100. With reference to FIG. 12A, the waveguide link assembly 100 includes a waveguide bending structure 102 comprising a guide block 104 with bend surface 106 and a top surface 108. In the example shown, the bend surface 106 is convex and has a radius of curvature RB. The waveguide bending structure 102 also includes a V-groove block 110 with a support surface 112 that includes waveguide V-grooves 114.

The front-end sections 64 of the optical waveguides 52 bend around the bend surface 106 of the guide block 104 so that the end faces 66 of the optical waveguides no longer reside in an x-y plane and reside substantially at the top surface 22 of the PCB assembly (e.g., to within 2 mm above or below the top surface). The V-groove block 110 is arranged so that the waveguide V-grooves 114 of the support surface 112 engage the front-end sections 64 of the optical waveguides adjacent the waveguide end faces 66. Thus, the support surface 112 of the V-groove block 110 confronts the bend surface 106 so that the waveguide V-grooves 114 that engage and guide the front-end sections 64 of the optical waveguides 52 over the bend surface 106 of the guide block 104 to maintain bend sections ("bends") 60 in the optical waveguides.

In an example, the bends 60 can have a minimum bend radius RB that can be in the range from 1.5 mm to 3 mm, depending on the type of optical waveguides 52 employed. For example, optical waveguides 52 with a diameter of 125 microns can have a minimum bend radius of about 2.4 mm while optical waveguides with a diameter of 80 microns can have a minimum bend radius of about 1.5 mm. Of course the bends 60 can have a bend radius that is larger than the minimum bend radius for the given optical waveguides 52. The guide block 104 of the waveguide bending structure 102 can be made of glass and fabricated via a redraw processes, or it can be cut from a glass sheet and ground to define its various surfaces, including the bend surface 106. The bends 60 can range anywhere from a few degrees to 90 degrees.

FIG. 12B shows the waveguide link assembly 100 disposed on the top surface 22 of the PCB 20A, with the ferrule 80 residing immediately adjacent the front end 26 of the PCB 20A. FIG. 12C shows the addition of the second and third (lower and upper) PCBs 20B and 20C to form the PCB assembly 120 and the OE PCB 10. Note that only the upper PCB 20C includes the PCB access aperture 30. The waveguide bending structure 102 resides at least partially within the PCB access aperture 30.

During the PCB lamination process used to form the PCB assembly 120, the waveguide bend structure 102 is aligned with a PCB access aperture 30 so that after PCB lamination the top surface 108 of the guide block 104 is roughly flush with the top surface 22 of the upper PCB 20C. In other configurations, the top surface 108 of the guide block 104 may be preferably slightly above or slightly below the top surface 22 of the upper PCB 20C to accommodate coupling with additional optical coupling components as described below. It may also be preferable to position the top surface 108 of the guide block 104 slightly above the top surface 22 of the upper PCB 20C to allow the top surfaces 108 of many guide blocks to be simultaneously polished in a single polishing operation. Alternatively, the waveguide bending structure 102 may secured to the top surface 22 of the PCB assembly 120 so that it extends above the PCB top surface by the thickness THF of the waveguide bending structure, which in an example is in the range from 1.5 mm to 2.4 mm.

Figure 13A:
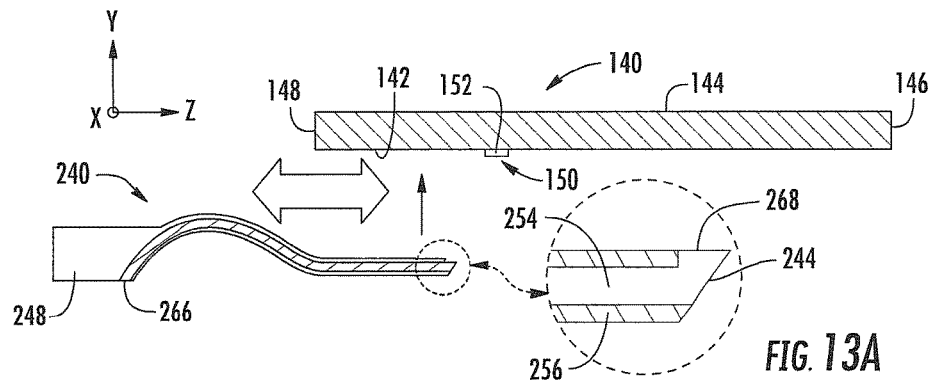
FIGS. 13A through 13G are y-z cross-sectional views that illustrate an example method of forming a photonic assembly using the S-shaped optical interconnector disclosed herein.
Figure 13B:
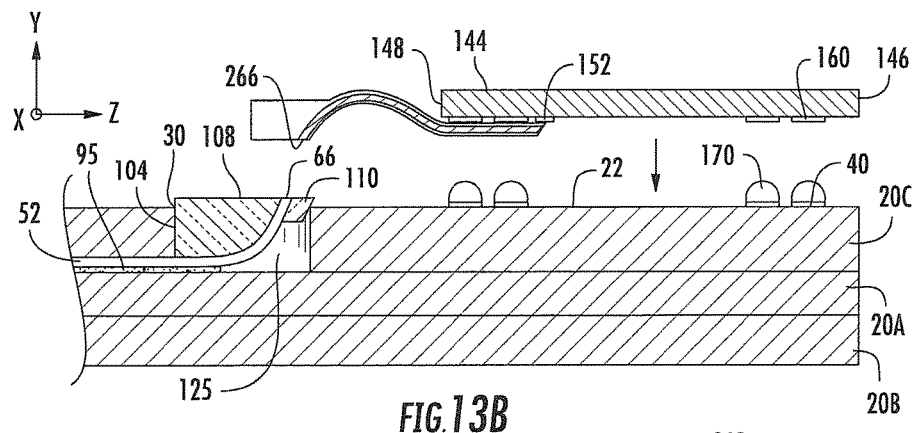
Figure 13C:
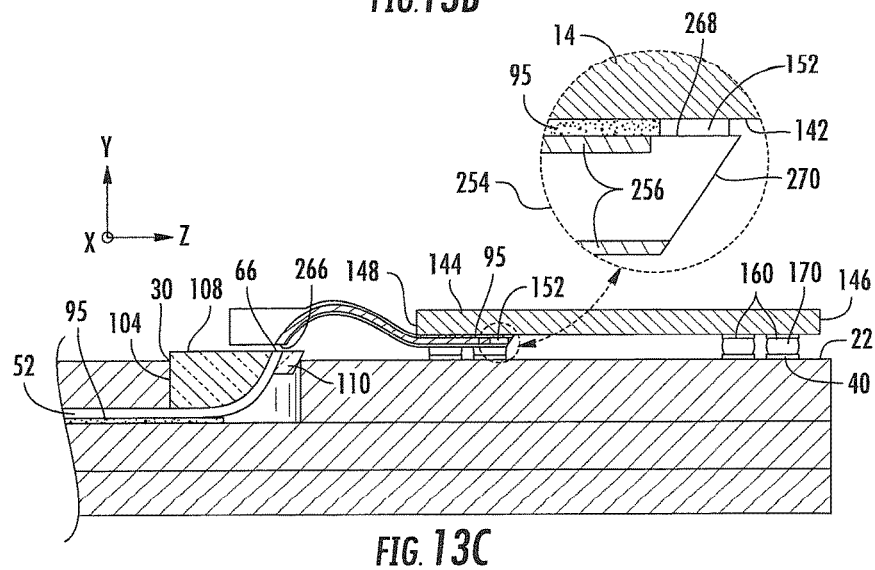
Figure 13D:
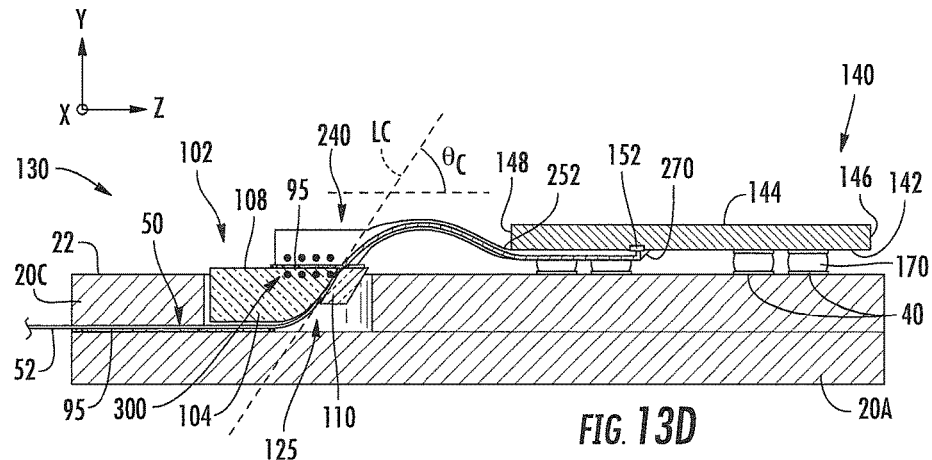

FIG. 13A shows an example optical interconnector 240 in the process of being operably attached to a OE-IC 140. FIGS. 13B and 13C show the optical interconnector in the process of being combined with the OE-PCB 10 of FIG. 12C to form a photonic assembly 130. FIG. 13D is a close-up view of center portion of the photonic assembly of FIG. 13C that shows more details of the optical interconnections. The optical interconnector 240 is used to optically interconnects optically couple) the optical waveguides 52 of the OE PCB 10 with the OE-IC devices 152 of the OE-IC 140 to form the photonic assembly 130.

Figure 14:
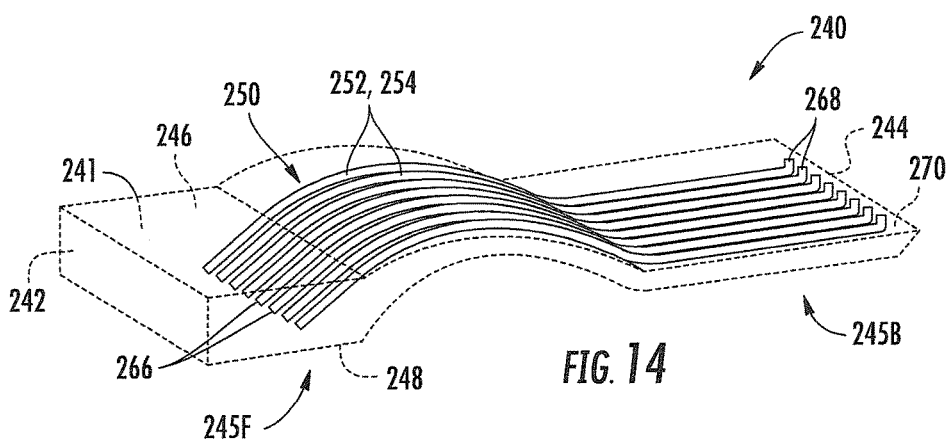
FIG. 14 is a front-end elevated view of an example optical interconnector that has a flat front-end section and a flat back-end section.

FIG. 14 is a front elevated view of an example optical interconnector 240. The example optical interconnector 240 includes the flat back-end section 245B and a flat front-end section 245F. The waveguides 252 of the optical interconnector 240 of FIG. 14 have upward facing back ends 268, which enables edge to interface with the OE-IC devices 152 of the OE-IC 140 as shown in FIG. 13D. The upward facing back ends 268 are enabled by either a strong but low-loss bend or a TIR surface in the waveguides 252 near the back ends.

As best seen in FIG. 13D, the flat front-end section 245F resides on the top surface 108 of the guide block 104 of the waveguide bending structure 102 while the flat back-end section 245B resides immediately adjacent the bottom surface 144 of the OE-IC 140. In this position, the front ends 266 of the waveguides 252 of the optical interconnector 240 are proximate to and confront the end faces 66 of the optical waveguides 52 of the OE PCB 10 while the back ends 268 of the waveguides are proximate to and confront the OE-IC devices 152 of the OE-IC 140 or alternatively reside along and are in optical contact with the OE-IC waveguides 180 such that evanescent coupling can occur.

Note also how the front-end sections of the waveguides 252 make about a 45 degree angle in the y-z plane while the bent front-end sections 64 of the optical waveguides 52 also make about 45 degree angle in the y-z plane so that the waveguides 252 and the optical waveguides 52 engage along a connection line LC that defines a connection angle $\theta_C$ about 45 degrees in the y-z plane as measured relative to the z-axis. The S-bend shape of the optical interconnector 240 provides flexibility that helps in positioning its front and back ends 242 and 244 to achieve optimum alignment. In other embodiments the connection angle can be substantially less than 45 degrees, such as 10 degrees or 5 degrees.

Figure 13E:
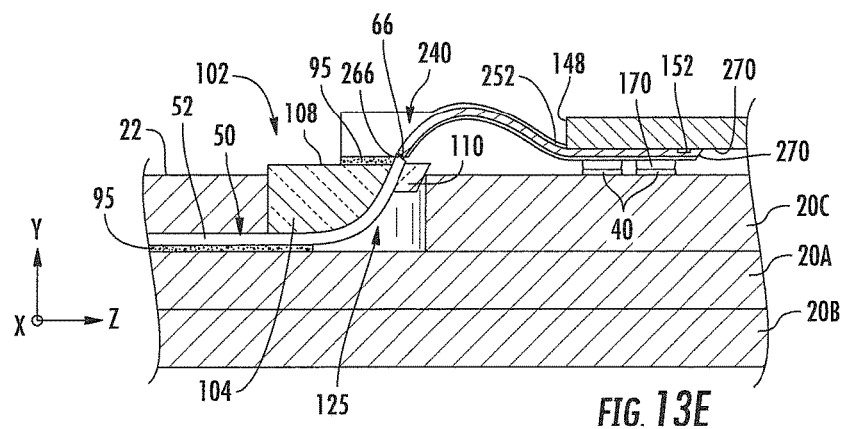
Figure 13F:
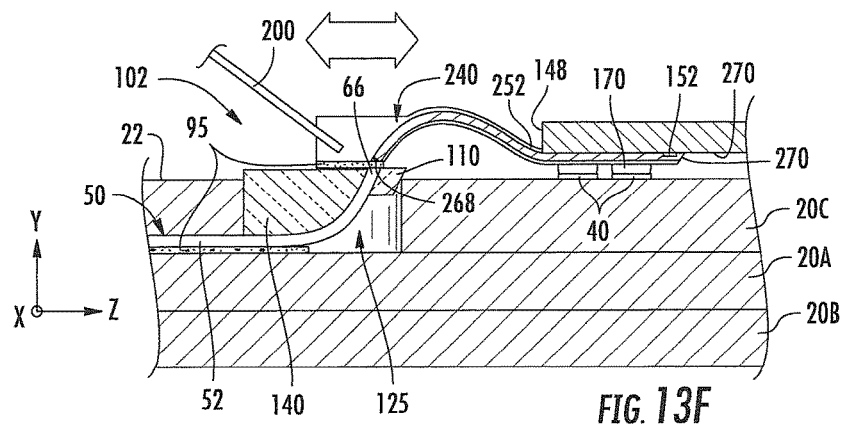

FIG. 13E shows the optical interconnector 240 in position in the photonic assembly 130 but with the flat front-end section 245F unattached to the waveguide bending structure 102 after the solder bump reflow process that electrically connects the OE-IC 140 with the PCB assembly 120. At this point, the gripper tool 200 can be used to move the flat front-end section 245F to at least coarsely align the front ends 266 of the waveguides 252 of the optical interconnector 240 with the end faces 66 of the optical waveguides 52 held by the waveguide bending structure 102, as shown in FIG. 13F. Fine alignment can be accomplished by performing active alignment as described above to identify a target location for the flat front-end section 245 of the optical interconnector 240. Once so identified, the flat front-end section 245F of the optical interconnector 240 can be secured to the top surface 108 of the guide block 104 of the waveguide bending structure 102. This can be accomplished using the securing material 95, which can be a UV-curable adhesive irradiated with the UV laser beam LB.

In an alternative fabrication method, the optical interconnector 240 can also be aligned and secured to the waveguide bending structure 102 prior to or during the solder bump reflow process used to establish the flip-chip configuration for the OE-IC 140. In this case, the optical interconnector 240 preferably has sufficiently flexibility to accommodate displacements of the OE-IC 140 relative to the OE PCB 10 during solder reflow (e.g., 25 microns to 75 microns) without inducing excessive shear stresses at the adhesive joint between the top surface 108 of the guide block 104 of the waveguide bending structure 102 and the flat front-end section 245F of the optical interconnector 240.

Figure 13G:
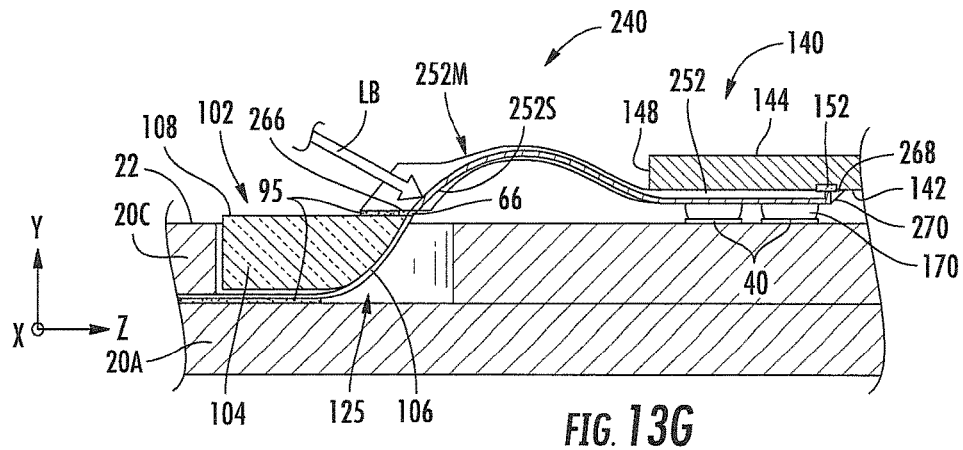

FIG. 13G is a close-up view of the waveguide bending structure 102 and the optical interconnector 240 similar to that shown in FIG. 13C and illustrates an embodiment wherein the waveguides 282 of the optical interconnector are not written in their entirety, i.e., they comprise main sections 282M do not extend all the way through the flat front-end section 245F. During assembly, the optical interconnector 240 can be coarsely aligned and secured to the waveguide bending structure 102. Then, the remaining sections 282S of the waveguides 282 of the optical interconnector 240 are laser written using laser beam LB to optically connect the waveguide front ends 296 with the optical waveguide end faces 66.

An advantage of the photonic assemblies 130 and fabrication methods described above that employ the waveguide bending structure 102 mated with the optical interconnector 240 is that the alignment of the optical interconnector takes place at the top surface 22 of the upper PCB 20C as opposed to within a PCB access aperture 30 as described in other embodiments. This makes it well-suited for automated alignment processing since visibility (both optically and for UV curing) and access to the coupling interface is improved.

Precision alignment can be provided via active alignment by measuring the coupled optical power or using a machine vision system 320 that images alignment features 330 such as fiducials and/or verniers (see FIG. 13D). The waveguides 252 of the optical interconnector 240 can be precision aligned to the alignment features 330 using laser forming techniques known in the art. Alignment features 330 in the form of verniers can be used to provide instant feedback on the amount of lateral shift during the UV adhesive curing process.

An advantage of the photonic assemblies 130 that employ the waveguide bending structure 102 mated to the optical interconnector 240 is that the active alignment interface 300 is located away from the edge (e.g., front end 26) of the PCB. This allows for additional PCB area to be used for OE-IC signal line escape routing from OE-IC BGA (Ball Grid Array) locations. This configuration also enables enhanced heat dissipation from the OE-IC 140 to PCB assembly 120.

With reference again to FIG. 13D, in an example a thin layer of securing material 95 (e.g., UV-curable adhesive) is deposited between the flat front-end section 245F of the optical interconnector 240 and the top surface 108 of the guide block 104 to provide a robust mechanical joint. This also limits the magnitude of any shifting due to the curing of the securing material 95 since the geometry limits non-uniform or asymmetric adhesive volumes at the joint. The angled connection as defined by the connection line LC shown in FIG. 13D defines an active alignment interface 300 that can serve to relax lateral alignment tolerances.

Figure 15:
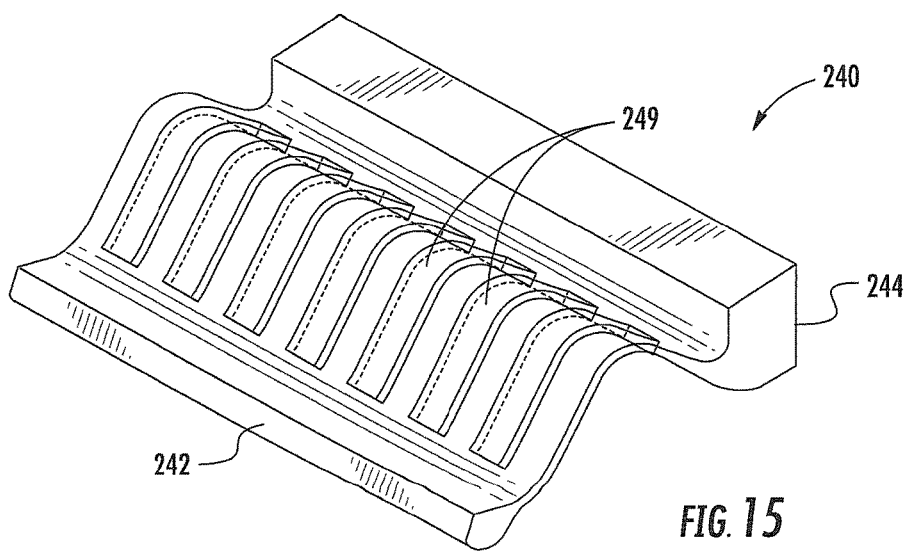
FIG. 15 is a front-end elevated view of another example optical interconnector that includes slots for improved flexibility.

The optical interconnector 240 can include a number of performance-enhancing features such curved shapes, flat bonding surfaces and TIR mirrors, which can be fabricated simultaneously using a part redraw process based on a precision preform. The optical interconnector 240 can also include other features, such as slots 249 for flexibility during alignment (see FIG. 15), and/or through access apertures or perimeter notches for actuator arm gripping during alignment.

Figure 16:
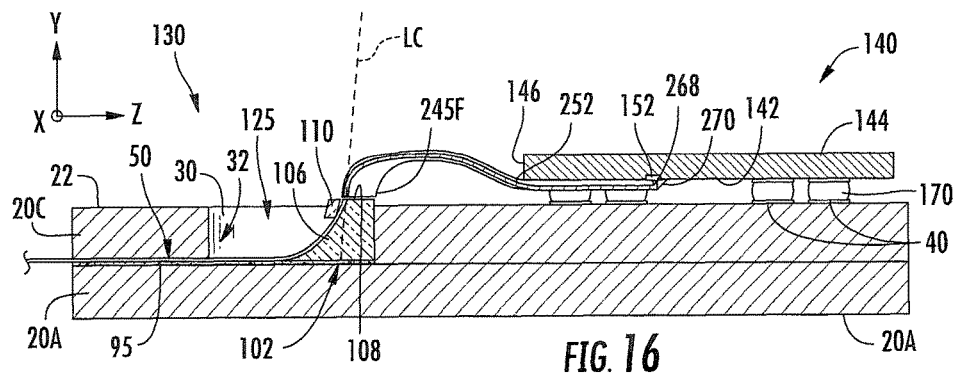
FIG. 16 is similar to FIG. 13C and illustrates an example photonic assembly wherein the bend surface of the guide block of the waveguide bending structure is concave rather than convex.

FIG. 16 is similar to FIG. 13C and illustrates an example photonic assembly 130 wherein the bend surface 106 of the guide block 104 of the waveguide bending structure 102 is concave rather than convex. This embodiment of the waveguide bending structure 102 can be implemented in cases where the connection line LC between the optical interconnector 240 and the waveguide bending structure 102 is nearly in the y-direction to enable a more compact configuration for the OE-IC 10 of the photonic assembly 130.

Figure 17:
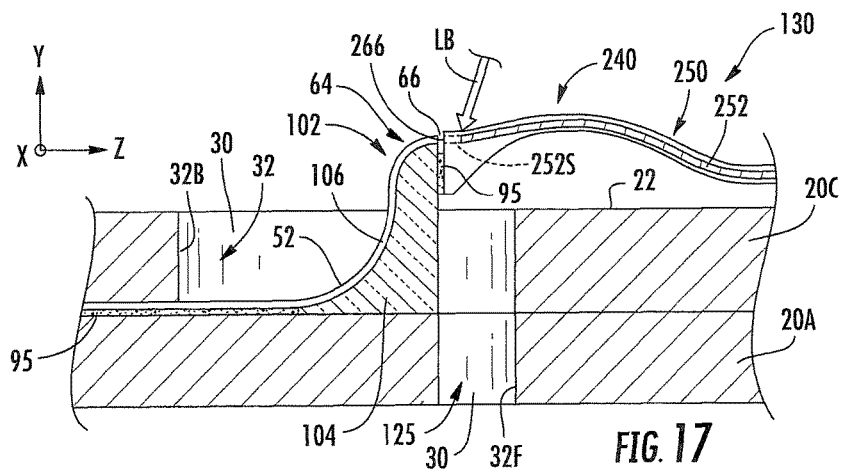
FIG. 17 is similar to FIG. 16 and illustrates an embodiment where the bend surface of the guide block of the waveguide bending structure has an S-curvature that imparts a corresponding S-curvature to the front-end sections of the optical waveguides.

FIG. 17 is similar to FIG. 16 and illustrates an embodiment where the bend surface 106 of the guide block 104 of the waveguide bending structure 102 has an S-curvature that imparts a corresponding S-curvature to the front-end sections 64 of the optical waveguides 52 supported thereon. In an example, the front-end sections 64 of the optical waveguides 52 do not need to be precisely aligned by, for example, a V-groove block 104, because subsequent laser writing of waveguide sections 282S can be used to create the proper alignment between the optical waveguides and the waveguides 280 of the optical interconnector 240. As in the previous embodiment, the present configuration places the active coupling interface 300 above the top surface 22 of the PCB 20C, thereby simplifying waveguide imaging and laser writing processes while also enabling the waveguide end faces 66 and 266 to be more easily prepared in polishing operations and their locations characterized.

In an example, a through access aperture 30' can be added to the PCB 20B directly below the active alignment interface 300 to enable laser writing of waveguide sections 282S from above without heating the lower PCB 20B below, or by simply performing laser writing using the through access aperture 30'. The through access aperture 30' can be tilted to align with an active coupling interface 300 that is oriented at an angle other than vertical.

Two-Part Optical Interconnector

Figure 18A:
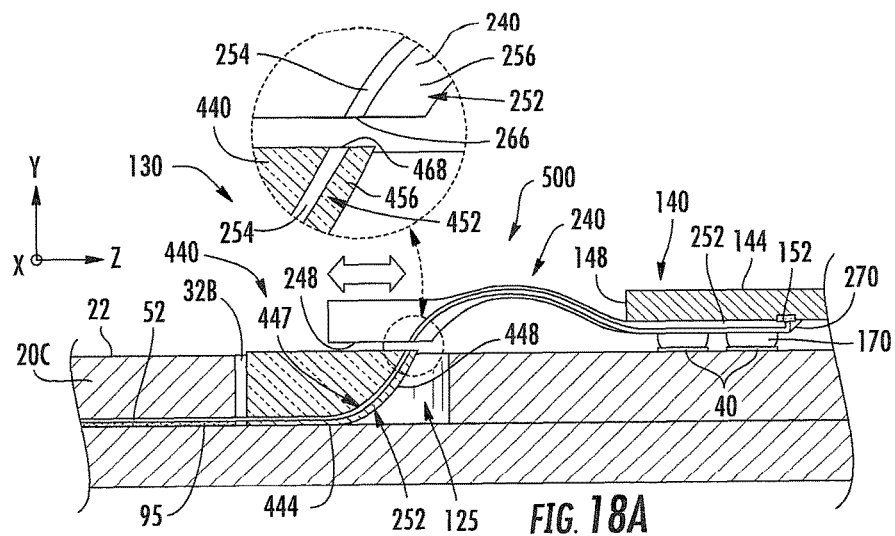
FIG. 18A is similar to FIG. 13C and illustrates an embodiment wherein the optical interconnector defines a first optical interconnector section and the waveguide bending structure is replaced with second optical interconnector that optically couples with the first optical interconnector.
Figure 18B:
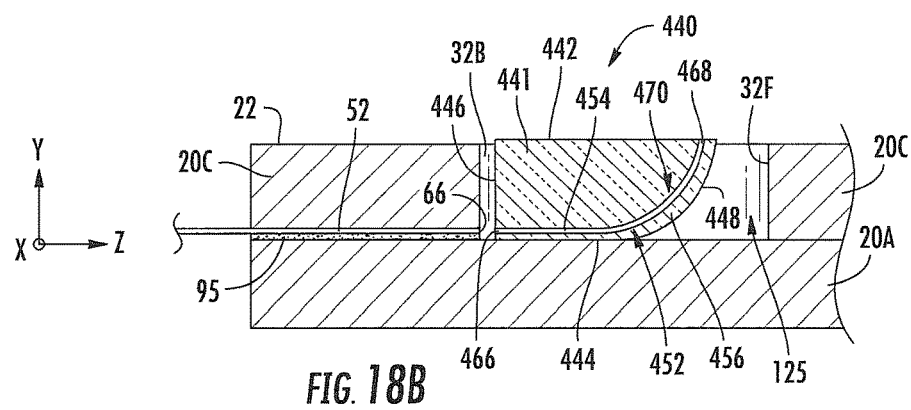
FIG. 18B is a close-up view of the example of the second optical interconnector section of FIG. 18A.

FIG. 18A is similar to FIG. 13C and illustrates an example photonic assembly wherein the optical interconnector 240 constitutes a first optical interconnector part or section and wherein the waveguide bending structure 102 is replaced with a second optical interconnector part or section 440 to define a two-part optical connector 500. The first and second optical interconnection sections 240 and 440 are shown slightly spaced apart for ease of illustration. FIG. 18B is a close-up view of the second optical interconnector section 440 disposed within the PCB access aperture of the PCB assembly 120. The second optical interconnector section 440 has a body 441 that includes a top surface 442, a bottom surface 444, a front end 446 and a back end 448. The second optical interconnector section 440 includes an array 450 of waveguides 452 as defined by cores 454 formed within the body 401 and a cladding 456 defined by the portion of the body that immediately surrounds the cores. In an example, the body 41 is formed from glass and the cores 452 are laser written into the glass body. Each waveguide 452 has a front end 466 at the front end 446 and has a back end 468 at the back end 448. Each waveguide 452 also has a curved section 470, which can generally follow a curved back end 468. While each waveguide 452 can be buried, in an example the curved section 470 of the waveguide can be close to the back end 448 so that the waveguide "cladding" is defined in part by the low-index air space within the main aperture 125 of the PCB assembly 120. This configuration for the waveguides 452 provides stronger optical confinement in the curved section 470 as compared to a cladding made entirely of the material of the body 441, which has a refractive index greater than that of air.

The second optical interconnector section 440 is configured such that when it is operably disposed in the OE PCB 10 at least partially within the main aperture 125, the front ends 466 of the waveguides 452 align with and are proximate to the end faces 66 of the optical waveguides 52 in the optical waveguide array 50 supported by the PLC assembly 120 while the back ends 468 are aligned with and are proximate to the front ends 266 of the waveguides 252 of the first optical interconnector section 240.

Active alignment techniques as described above can be used to align and then secure the second optical interconnector section 440 in a target location that maximizes optical coupling efficiency between the optical waveguides 52 and the waveguides 252 via the two-part optical interconnector 500.

The two-part optical interconnector 500 (and in particular the second optical interconnector section 440) eliminates the need for the V-groove alignment block 104 and also eliminates the need to bend the front-end sections 64 of the optical waveguides 52. The front and back ends 466 and 468 of the waveguides 452 of the second optical interconnector 440 can be enlarged (e.g., adiabatically flared) to improve lateral alignment tolerances.

The optical interconnector section 240 can have one or more flat surfaces that simplify observation (e.g., machine-vision viewing) of waveguide ends 286 that terminate within the body 241 and that enable laser writing of the waveguide sections 282S after attachment to provide for fine alignment. The first optical interconnector section 240 can also incorporate additional facets that substantially prevent the laser beam LB from being incident upon the PCB assembly 120 during laser writing of the optical interconnector waveguides 252. The top surface 22 of the PCB assembly 120 and/or surfaces within the main aperture 125 can be metallized to reflect laser light and prevent PCB surface damage. A small reflective element (e.g., a mirror, a metal substrate, etc.) can also be temporarily inserted into the main aperture 125 to reflect laser light away from the PCB assembly 120. An absorber element can also be temporarily inserted into the main aperture 125 to absorb laser light that would otherwise be incident upon the PCB assembly 120.

Figure 19:
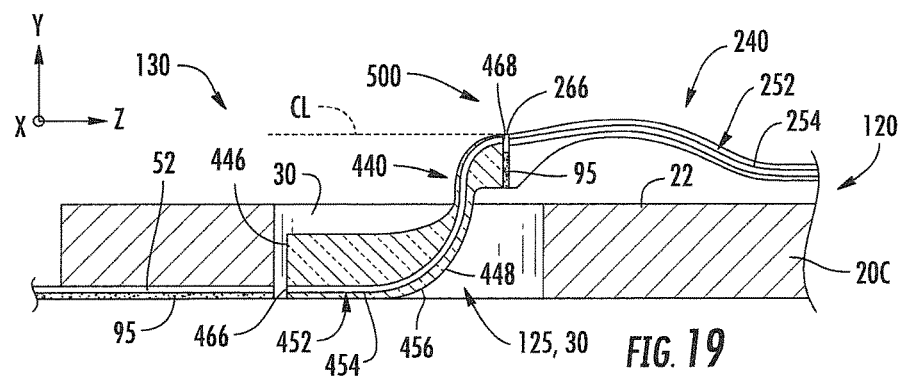
FIG. 19 is similar to FIG. 18 and is a close-up view that illustrates an example second optical interconnector section having an S-shape so that the front and back ends of the second light-redirecting element can reside in substantially perpendicular planes so that the connection line of the optical connector assembly is substantially horizontal.

FIG. 19 is a close-up view of an example two-part optical interconnector 500 wherein the waveguides 452 of the second optical interconnector section 440 have an S-shape such that the front ends 466 and back end 468 can reside in substantially perpendicular planes. This allows for the active alignment interface 300 to be oriented substantially in the vertical direction (i.e., y-direction) (i.e., a connection line CL in substantially the z-direction), in contrast to the active alignment interface of FIG. 12, which is oriented in the horizontal direction (i.e., z-direction). This vertical orientation of the active alignment interface 300 can aid in imaging the locations of terminated waveguides 282 within the body 241 of the first optical interconnector section 240 and writing the remaining waveguide sections 252S and/or 452S after securing the first optical interconnector section 240 to the second optical interconnector section 440 using for example securing material 95.

PCB Assembly with Cavity

Figure 20:
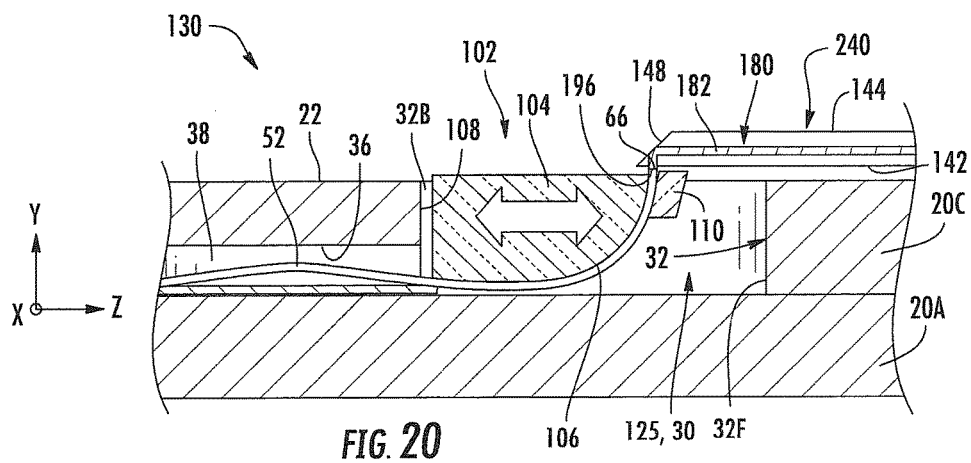
FIGS. 20 and 22 are cross-section views similar to FIG. 13C and illustrate examples wherein the PCB assembly includes a cavity through which passes the array of optical waveguides of the waveguide link assembly.

In all of the previous embodiments, the optical waveguide array 250 is sandwiched between adjacent PCBs 20 so that waveguides are firmly secured within the PCB assembly 120. FIG. 20 is a close-up view of a central portion of the OE-PCB 10 of an example photonic assembly 130 wherein the PCB assembly 120 includes a recess 36 formed in the bottom surface 24 of the upper PCB 20C adjacent the front edge 32F of the PCB access aperture 30. When the PCB layers 20A and 20C are laminated together, the top surface 22 of the PCB layer 20A and the recess 36 in the bottom surface 214 of the PCB layer 20C define a cavity 38 within the PLC assembly 120. The optical waveguide array 50 runs through the cavity 38 and has some slack within the cavity so that the optical waveguides 52 can move during fabrication of the photonic assembly 130 as well as during the product life of the photonic assembly. For example, CTE mismatches in the components of the photonic assembly 130 can result in movement of the optical waveguides 52. FIG. 20 shows how movement of the waveguide bending structure 102 during alignment can cause movement of the optical waveguides 52. This movement can be both axially (z-direction) and laterally (x and y directions).

The PCB cavity 38 can be enlarged axially or laterally as needed to provide greater freedom of movement of the optical waveguides 52 or to store substantial amounts of slack in the optical waveguides 52. Multiple cavities 38 can be formed at various PCB locations along the z-direction to allow for gradual low-loss waveguide bending, which can take place during integration of the waveguide link assembly 100 in the PCB assembly 120 during PCB lamination, or during movement of the waveguide bend structure 102 during alignment and securing operations. The one or more cavities 38 can be large enough to encompass a 360° waveguide bend, or it may be integrated into a right-angle bend, where additional cavity volume is provided around the bend to allow the waveguide radius to increase or decrease slightly due to axial displacement.

Figure 21:
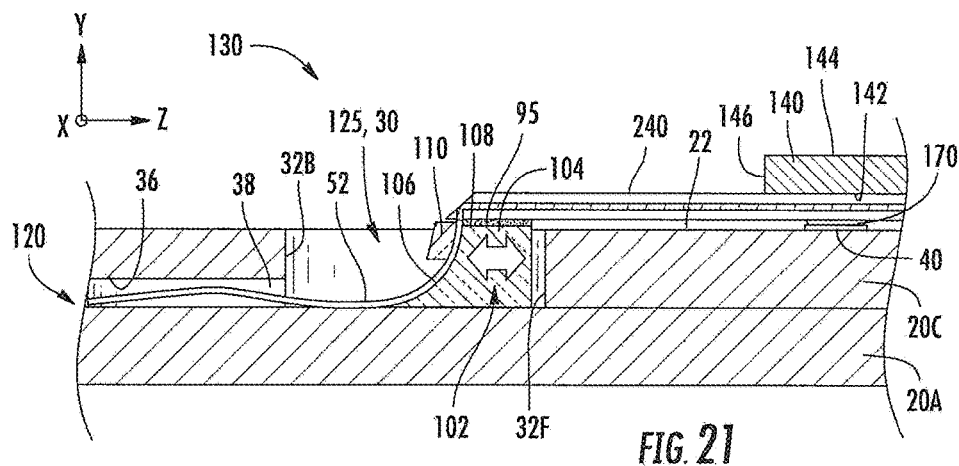

The cavities 38 can also be used to facilitate the use of the waveguide bend structure 102 as well as the light-redirecting element 400. For example, with reference to FIG. 21, when the bend surface 106 of the guide block 104 is concave, a cavity 38 adjacent the PCB access aperture 30 can be used to provide space for the optical waveguides 52 to bend in a way that allows the optical waveguide to run conformally (flat) along the bend surface 106.

In an example, one or more portions of the optical waveguide array 50 are in the form of an optical waveguide ribbon, i.e., are ribbonized, while other portions are "loose," i.e., unconfined by ribbonization. Example embedded waveguide link assemblies 100 disclosed herein include select ribbonized portions of the optical waveguide array 50 where it is important for the optical waveguide array to maintain coarse alignment of the optical waveguides 52 during handling and assembly operations, such as at the ends of the waveguide link assembly.

In another example, it can be important to join loose optical waveguides 52 together periodically to make the waveguide link assembly 100 manageable during PCB lamination when forming the OE PCB 10. The regions in the optical waveguide array 50 where the optical waveguides 52 are loose allow the optical waveguides to move over one another when they are constrained in a tight bend, or as they are axially compressed or extended during PCB lamination, during alignment and attachment of the waveguide bending structure 102, or due to CTE mismatches of components of the photonic assembly 130.

Figure 22:
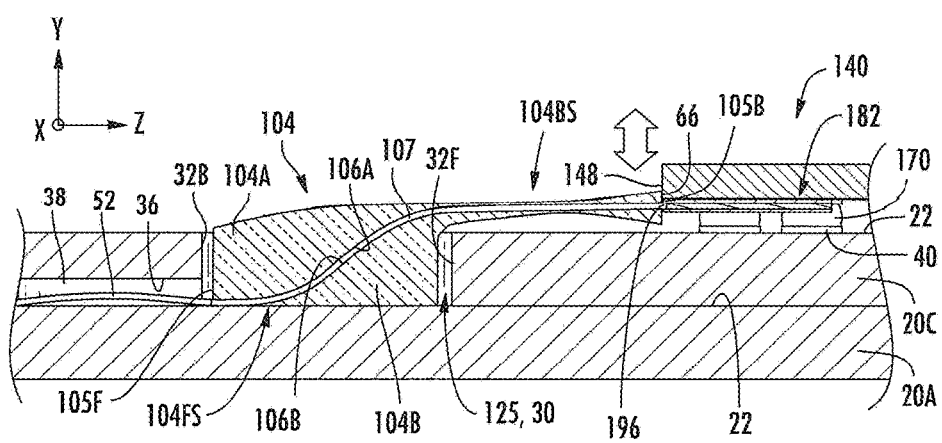

FIG. 22 illustrates an embodiment wherein the waveguide bending structure 102 consists of a guide block 104 configured to obviate the need for an optical interconnector 240 and/or 440. In an example, the guide block 104 can consist of two pieces 104A and 104B that respectively include bend surfaces 106A and 106B that define a guide channel 107 when the two pieces 104A and 104B are mated, and wherein the guide channel 107 guides the optical waveguides 52 from the OE PCB 10 to the OE-IC 140. In another example, the guide block 104 can be monolithic and include a guide channel 107 formed therein via a laser writing process.

In an example, the PCB assembly 120 includes a PCB cavity 38 that allows for the guide block 104 to be displaced during the alignment and securing process. The guide block 104 can be made using a glass redraw process. In an example, the guide block 104 includes a relatively thick front-end section 104F with a front end 105F and that resides at least partially within the PCB access aperture 30 and a flexible back-end section 104B that has a back end 105B and that resides adjacent the OE-IC 140. The flexible back-end section 104B is configured to accommodate motion of the OE-IC relative to the PCB assembly 120. The flexible back-end section 104B can have an enlarged back end 105B to increases the bonding area between the guide block 104 and the front end 146 of the OE-IC 140. In an example, the guide block 104 can also be configured to provide evanescent coupling between the optical waveguides 52 supported in the guide block and the OE-IC waveguides 282 of the OE-IC 140.

Providing Added Functionality to the OE PCB Using the Waveguide Link Assembly

The waveguide link assembly 100 integrated into the PCB assembly 120 to form the OE PCB 10 can be used to provide additional functionality beyond simple optical communication with an OE-IC 140. For example, if the optical waveguide array 50 is routed in a regular pattern adjacent to high-frequency electrical traces, the low dielectric constant of the glass of the optical waveguides 52 may be used to improve electrical link performance.

In another example, the optical waveguides 52 can be coated with one or more metallization layers that enable simultaneous electrical and optical transmission using the optical waveguide. The one or more metallization layers can be used for either signal or power distribution. Optical waveguide metallization can also be used to improve heat transfer away from one or more OE-ICs 140 of the photonic assembly 130.

Optical Waveguides for the OE PCB

Examples of the OE PCBs 10 disclosed herein employ optical waveguides 52 having one or more select properties that optimize their performance when integrated with the PCB assembly 120. For example, dense optical waveguide layouts for the OE PCBs 10 required optical waveguides that can sustain tight bends with low optical loss. Thus, in an example, the optical waveguides 52 have refractive index profiles that provide the optical waveguides with low loss at relatively small bend radii. This allows for the optical waveguides to be routed around PCB obstacles such as vias and highly populated regions underneath and near flip-chip mounted components, thereby reducing the amount of PCB area that must be dedicated to optical waveguide links, and increasing the density of optical links distributed across an optical PCB.

In an example embodiment, the optical waveguides 52 have a loss of <0.1 dB when bent through a full turn at a 5 mm bend radius or a loss of <0.4 dB per full turn at a 7.5 mm bend radius.

In another example, the optical waveguides 52 are multimode wherein the fundamental mode is substantially matched to the fundamental mode of a conventional single mode waveguide such as the SMF-28® single mode optical waveguide made by Corning, Inc. of Corning, N.Y. In an example, the multimode optical waveguides 52 have parabolic index profiles provide strong optical confinement in tight bends and limited coupling of optical power from the fundamental mode to higher order modes due to bending.

In an example, the optical waveguides 52 have cores 54 that are smaller than standard single mode optical waveguides and in addition can have a relative refractive index that is higher than standard single mode optical waveguides. For example, the core diameter of the optical waveguides can be smaller than 8.2 µm, e.g., between 2 µm and 6 µm, in order to match the mode-field diameter (MFD) of OE-IC waveguides 282. Alternatively, the optical waveguides 52 can have an MFD with an intermediate value between the MFD of standard single mode optical waveguide and the MFD of the OE-IC waveguides 282 so that the total coupling loss over the entire optical path through the photonic assembly 130 is minimized.

In another example, the optical waveguides 52 have a reduced diameter of the cladding 56 to improve the long-term reliability of the optical waveguides given that they may be subjected to tight bending. Thus, in an example, the optical waveguides 52 can have a cladding diameter in the range from 30 µm to 100 µm as compared to the standard diameter of 125 µm. It is known for example that a standard coated single mode waveguide having a 125 µm outer diameter (i.e., cladding diameter) can have a bend radius as small as 2.4 mm while a coated single mode optical waveguide with a diameter of 80 µm can have a bend radius as small as 1.5 mm. In other examples, the optical waveguides 52 can have a cladding diameter of 80 µm have bending losses of <0.01 dB/turn at a 10 mm bend radius. In an example, the optical waveguides 52 have a combination of features such as a small core diameter, a small cladding diameter and large relative refractive index (as compared to a standard single mode optical waveguide) to ensure acceptable (low loss) bending performance.

In an example, the optical waveguides 52 need to be resistant to the thermal conditions associated with PCB lamination and solder bump reflow, where temperatures of 180° C. to 200° C. and higher may be experienced for brief periods of time, e.g., 1 min to 2 min. Such optical waveguides are available, and include Corning® Mid-Temperature Specialty Optical Waveguides, which are rated for temperatures of up to 180° C. and employ protective coatings 56 that are acrylate-based and that also provide improved fatigue performance. In addition, Corning® ClearCurve® Single-Mode Mid-Temperature Specialty Optical Waveguides for Harsh Environments are rated up to 180° C., with test data up to 200° C. In an example, the optical waveguides 52 employ a coating 58 made of polyimide or like materials that can withstand temperatures in excess of 300° C.

Given that the optical waveguides 52 are integrated with the PCB assembly 120, it is desirable that both the diameter of the cladding 56 and the diameter of the protective coating 58 be as small as possible to minimize local variations in the overall thickness of the OE PCB 10. Thin protective coatings 58 can be applied with less variation in coating thickness and can enable accurate waveguide core alignment for unstripped waveguides that are passively aligned to precision alignment surfaces or V-grooves. In an example, Corning® Hermetic Single-mode and Multimode Specialty Optical Waveguides provide a thin durable protective coating 56 that is applied directly to the cladding 56.

In another example, the protective coating 58 can be elastomeric so that it can help to distribute point contact stresses that can occur in configurations where the optical waveguides 52 cross within an OE-PCB, as shown in FIGS. 20A and 20B. An elastomeric protective coating 58 can also be useful for accommodating stresses that arise from CTE mismatches between silica glass optical waveguides 52 and the resin impregnated woven fiber glass PCBs 20. For example, optical waveguides 52 can have a protective coating 56 made of one or more elastomeric polymers (e.g., silicones and/or polyacrylates).

In another example, the protective coating 56 of the optical waveguides 52 is more abrasion resistant than the standard polymeric protective coating. An example of an abrasion-resistant protective coating 56 includes a metal oxide such as titanium oxide. An abrasion-resistant protective coating for the optical waveguides 52 can reduce wear and tear on the optical waveguides due to movement during the alignment process and due to CTE mismatched when deployed.

Integrating the Optical Waveguide Array with the PCB Assembly

As described above, the OE PCB 10 comprises a waveguide link assembly 100 integrated with a PCB assembly 120. Automated equipment can be used for deploying optical waveguides 52 on a PCB 20 along precise (select) paths. In a typical embodiment, a waveguide feeding tool can rapidly pay out the optical waveguide 52 as the tool traverses over a fixed PCB. The throughput of the waveguide deployment process is limited in part by the maximum traverse velocity of the waveguide feeding tool. Stresses can be introduced in the optical waveguides 52 any time there is a difference between the traverse velocity and the waveguide feeding velocity. The optical waveguides 52 can also be stressed as they bend during the transition from the waveguide feeding tool to the planar PCB surface 22 that supports the optical waveguides.

Thus, in an example, optical waveguides 52 that can sustain relatively high axial pull stresses and rapid bending through small radius bends are desirable for increasing waveguide laydown velocity and process throughput. Optical waveguides 52 having one or more of the select properties described above are well-suited for rapid automated optical waveguide deployment on the PCBs 20 while minimizing waveguide damage or breakage.

The optical waveguides 52 used in automated deployment equipment may not need to meet all of the requirements typically required when optical waveguides are manually deployed or manually routed and connectorized. For example, since waveguide coating stripping processes are preferably automated, it may be possible to use waveguide coating technologies that would require coating stripping forces that would be difficult for a manual laborer to implement or control manually. Likewise, since optical waveguides 52 are not handled manually during the automated waveguide deployment process, it may be possible to use reduced-diameter optical waveguides 52 (e.g., 80 µm or less) that would be more likely to break if handled manually. In an example, the automated equipment used to fabricate the photonic assembly 130 can be designed with waveguide strain feedback measurement capability to ensure that more fragile optical waveguides 52 are not subjected to excessive strains. On the other hand, smaller optical waveguides can be bent more tightly before breaking and so this could simplify and speed up waveguide deployment process.

Securing the Optical Waveguides within the PCB Assembly

As discussed above, when forming the OE-PCB 10, the array 50 of optical waveguides 52 can be secured on the surface 22 of the PCB layer 20A using the securing material 95. In an example, the securing material 95 comprises a pressure sensitive adhesive. Alternatively, the securing material 95 can comprise a UV-curable adhesive. The securing material 95 can be applied over a portion of the top surface 22 of the PCB layer 20A. As optical waveguides 52 are deployed on the surface 22 of the PCB layer 20A, the securing material 50 can be immediately and selectively activated. For example, where the securing material 95 comprises a UV-curable adhesive, the optical waveguides 52 can be tacked in place using a focused UV beam LB. The focused laser beam LB can follow the path of the waveguide feeding tool used to deploy the optical waveguides 52. In a similar approach, the securing material 95 is only applied on the optical waveguides 52 immediately before the optical waveguides are deployed onto the top surface 22 of the PCB 20A. As discussed above, in an example a focused UV light LB can the waveguide feeding tool path and be used to cure a UV-curable adhesive and tack the optical waveguides 52 onto the top surface 22 of the PCB 20A.

The securing material 95 in the form of a UV curable adhesive may also be cured by UV light LB that is coupled into the optical waveguide as it bends within the waveguide feeding tool. This UV light LB is unguided by the optical waveguide core and cladding and thus couples out of the cladding and into the UV curable adhesive that surrounds the optical waveguide. An advantage of this approach is that the UV light LB can follow the optical waveguide for a distance along the waveguide path, even in cases where the optical waveguide is deployed with one or more bends along its path.

In another example, the securing material 95 comprises a two-part adhesive and is used bond the optical waveguides 52 to the top surface 22 of the PCB layer 20A. A first part of the two-part adhesive is pre-applied to the top surface of the PCB layer 20A while the second part of the two-part adhesive is applied to the optical waveguides 52 prior to deploying on the PCB assembly 120. When the optical waveguides 52 are deployed onto the top surface 22 of the PCB layer 20A, the first and second parts of the two-part adhesive react and then cure.

Optical Waveguide Crossings

Figure 23A:
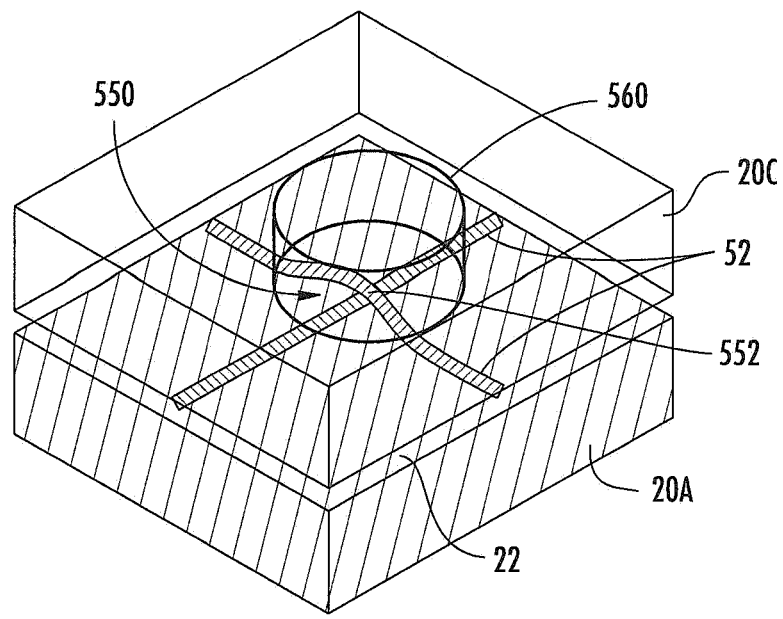
FIGS. 23A and 23B are elevated and top-down views, respectively, of example waveguide crossings that can occur within the OE-PCB.
Figure 23B:
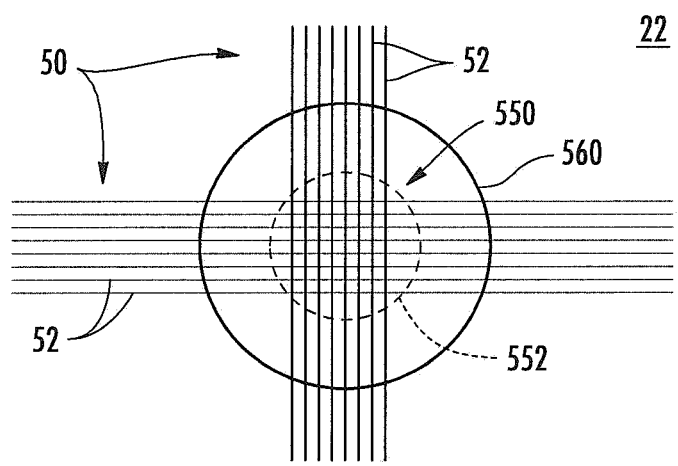

In an example, the array 50 of optical waveguides 52 can include waveguide crossings 552 at a waveguide crossing location 550, as shown in FIGS. 23A and 23B. Such waveguide crossings can be expected when routing the optical waveguides 52 from one end of the OE-PCB 10 to an OE-IC 140 located near the middle or towards the opposite end of the OE-PCB. In general, the waveguide crossings 552 involve only two individual optical waveguides 52 or two arrays 50 of optical waveguides 52.

A concern with waveguide crossings 552 is that during the PCB lamination process, the waveguide crossing location 550 will serve as a stress concentrator that locally bends the crossed optical waveguides 52 through a small bend radius. As mentioned above, elastomeric protective coatings 58 on the optical waveguides 52 can be used to distribute these compression forces over a larger area, allowing for a smaller bend radius. Optical waveguides 52 designed for low loss and high reliability when bent through small radius turns may also be well-suited for configurations of the photonic assembly 130 that includes waveguide crossings 552.

In an example, recesses 560 can be positioned to line up with the waveguide crossing locations 550 reduce or eliminate stress that can otherwise be induced in the crossed optical waveguides 52 at the waveguide crossing 552 during PCB lamination. In the example shown in FIG. 23B, the recess 560 formed in the top surface 22 of the PCB layer 20A for example can be made large enough so that multiple waveguide crossings 552 can be accommodated within a single via, e.g., when two optical waveguide arrays cross. In an example, the recesses 560 are defined by pre-existing vias or blind vias formed in the PCB layer 20A and/or the PCB layer 20C.

Example Waveguide Link Assemblies

Figure 24:
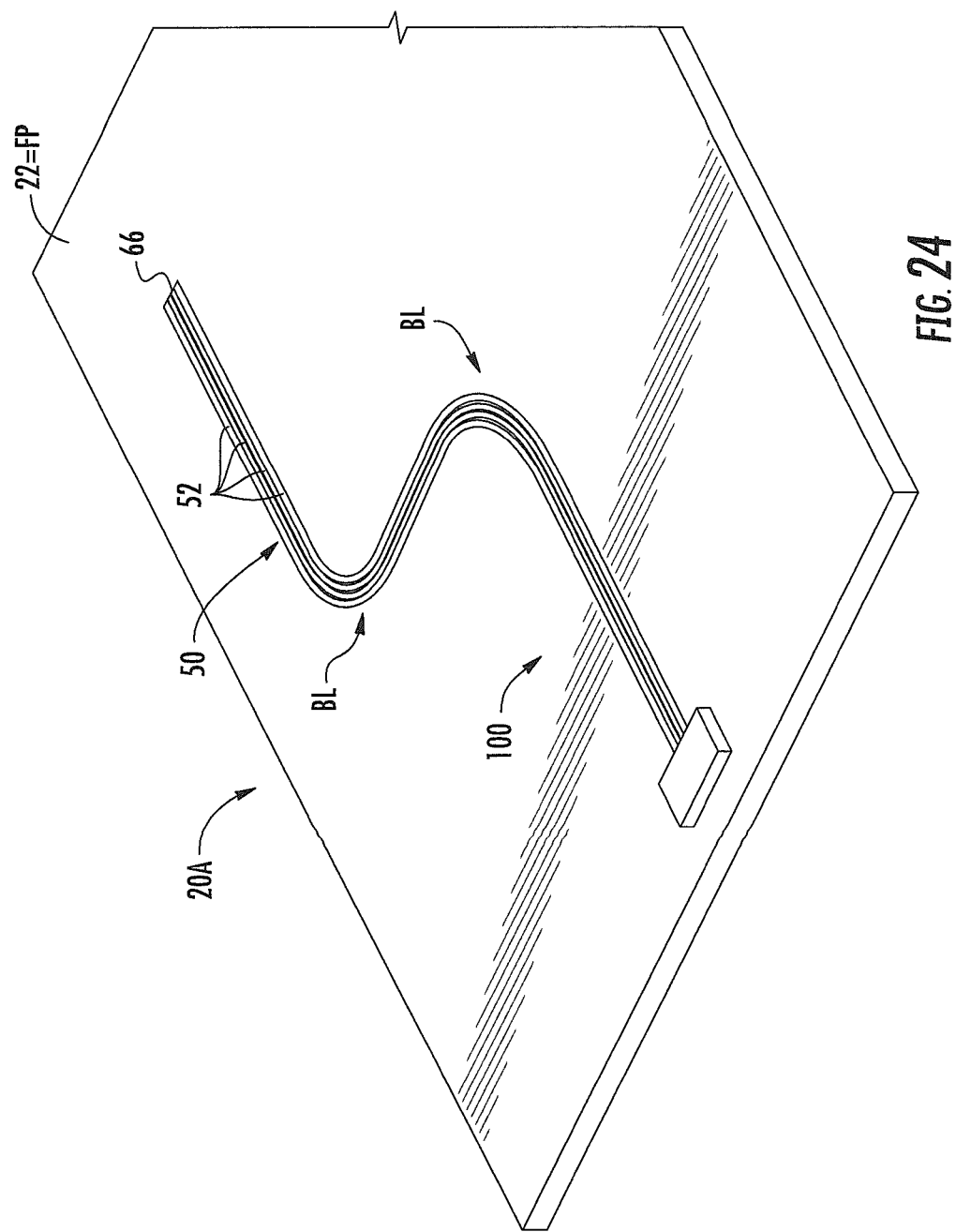
FIG. 24 shows an example waveguide link assembly disposed on the top surface of a PCB layer, wherein the optical waveguides all lie in the same plane and have in-plane bend locations.

It is preferred that the optical waveguides 52 of the waveguide link assembly 100 lie flat on the top surface 22 of the PCB 20A. However, this can be difficult to achieve when the optical waveguides 52 are fixed within a cable such as a cable ribbon, which has very limited in-plane flexibility. FIG. 24 shows an example waveguide link assembly 100 disposed on the top surface 22 of the PCB layer 20A, wherein the optical waveguides 52 all lie in the same waveguide plane FP and wherein the optical waveguides traverse a curve path within the waveguide plane.

This is accomplished by allowing the optical waveguides 52 to have different in-plane bend radii at in-plane bend locations BL. This configuration can be achieved using a multi-waveguide feeding tool that allows the waveguide feed rate to be varied on a waveguide-to-waveguide basis wherein the optical waveguides on the outside of the bend have a larger bend radius to accommodate the other waveguides in the waveguide array closer to the center of the bend. This configuration allows the array 50 of optical waveguides 52 to lay flat on the top surface 22 of the PCB 20A. The feed rate of the optical waveguides 52 located near the outside of the in-plane bend is made higher than for optical waveguides located near the inside of the bend so that through the in-plane bend the optical waveguides are arranged on fixed pitch.

The length of the optical waveguide 52 that reside at or near the inside of the bend location BL will be less than those on or near the outside of the bend location and this must be considered when using the waveguide array bending apparatus. In addition, in an example, all in-plane bends that are not smaller than allowable (minimum) bend radius.

In an example, the optical performance of the waveguide link assembly 100 can be tested prior to integrating it with the PCB assembly 120. Also in an example, connectorized ends of the waveguide link assembly are protected through subsequent PCB lamination and flip-chip attachment solder reflow processes.

High-Density OE PCBs and Method of Forming Same

Using one or more arrays 50 of optical waveguides 52 integrated with a PCB assembly 120 can involve tens, hundreds or even thousands of optical interconnections. Even if each optical waveguide interconnection requires only a few seconds, the fabrication time for a high-density photonic assembly 130 could take hours. Thus, the fabrication of high-density photonic assemblies can benefit from OE PCB designs and fabrication methods that can reduce the overall fabrication time.

For example, in one fabrication method, many optical waveguides 52 are applied to the top surface 22 of the PCB layer 20A simultaneously. Using this approach, the time required to fabricate any arrayed waveguide link assembly 100 can be reduced by a factor N, where N is the number of optical waveguides 52 that can be laid down simultaneously.

In another example such as shown in FIG. 25, arrayed waveguide link assemblies 100 can be pre-fabricated, with the optical waveguides 52 each following a similar route across the top surface 22 of the PCB layer 20A. In an example, the optical waveguides 52 can be arranged on a carrier sheet 600, pretested, and then applied to the top surface 22 of the PCB layer 20A in a single step.

Further in the example shown in FIG. 25, larger, more complex waveguide link assemblies 100 can be fabricated by laying out multiple waveguide link assemblies on a common carrier sheet 600 to form a waveguide link assembly sheet 610. In this example, the waveguide link assemblies 100 are grouped based on similarities in their starting and ending locations on the OE PCB 10. Each waveguide link assembly sheet 610 can have all of its waveguide link assemblies 100 pretested prior to attachment to a PCB 20.

In another example, the OE PCB 10 can include multiple waveguide link assemblies 100 sandwiched between different PCB layers 20. The optical waveguides 52 associated with each layer of a multilayer OE PCB 10 can be integrated into multiple waveguide link assemblies and/or waveguide link assembly sheets. Each layer of the multilayer OE PCB 10 can be pretested prior to PCB lamination into a complete multilayer OE PCB.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A photonic assembly, comprising:
   an optical-electrical printed circuit board (OE-PCB) comprising a printed circuit board (PCB) assembly with at least first and second PCB layers and comprising opposite first and second ends, a major surface and an access aperture in the major surface disposed between the first and second ends, and an optical waveguide array disposed between the at least first and second PCB layers, the optical waveguide comprising a first-end section with an end face accessible through the access aperture;
   an optical-electrical integrated circuit (OE-IC) operably disposed on the top surface of the PCB assembly, the OE-IC having at least one OE-IC device;
   an optical interconnector having at least one optical interconnection waveguide and disposed so that the optical interconnection waveguide optically interconnect the optical waveguide of the OE-PCB with the at least one OE-IC active device of the OE-IC; and
   a waveguide bending structure that resides at least partially within the access aperture to which the first-end section of the optical waveguide is secured to define bends in the optical waveguides so that the end face of the optical waveguide resides substantially at or above the major surface of the PCB assembly;
   wherein the waveguide bending structure comprises a guide block with a top surface, and wherein the optical interconnector comprises a flat first-end section that is secured to the first surface of the guide block.

2. The photonic assembly according to claim 1, wherein the body of the optical interconnector comprises glass and wherein the optical interconnection waveguide is defined within the body of the glass.

3. The photonic assembly according to claim 1, wherein the optical interconnector has first and second ends and comprises a turn such that the first end of the optical interconnector resides in plane different than the second end of the optical interconnector.

4. The photonic assembly according to claim 1, wherein the optical interconnector has first and second ends and comprises an S-shape such that the first and second ends of the optical interconnector reside in offset planes.

5. The photonic assembly according to claim 1, wherein the optical interconnector comprises first and second optically coupled sections.

6. The photonic assembly according to claim 5, wherein the first optically coupled section resides at least partially within the access aperture of the PCB assembly and wherein the second optically coupled section resides upon the major surface of the PCB assembly.

7. The photonic assembly according to claim 1, wherein the waveguide bending structure comprises a guide block having a bend surface and a first surface, and a V-groove block that includes a support surface that confronts the bend surface and that includes waveguide V-grooves that engages and guides the optical waveguide over the bend surface.

8. The photonic assembly according to claim 1, wherein the flat first-end section is secured to the top of the guide block using an adhesive.

* * * * *